(12) United States Patent
Moser et al.

(10) Patent No.: US 6,853,696 B1
(45) Date of Patent: Feb. 8, 2005

(54) METHOD AND APPARATUS FOR CLOCK RECOVERY AND DATA QUALIFICATION

(75) Inventors: James Moser, Ottawa (CA); Matthew D. Brown, Kanata (CA); Michel Pigeon, Nepean (CA); Marc A. Nadeau, Kanata (CA); Chung Y. Wu, Kanata (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/466,665

(22) Filed: Dec. 20, 1999

(51) Int. Cl.⁷ .................................................. H03D 3/24
(52) U.S. Cl. ...................... 375/375; 375/371; 375/372; 375/373; 375/374; 375/375; 375/376
(58) Field of Search ................................ 375/371–376, 375/261, 357; 331/1 A, 25; 702/25

(56) References Cited

U.S. PATENT DOCUMENTS

| | | | | |
|---|---|---|---|---|
| 5,512,860 A | * | 4/1996 | Huscroft et al. | 331/1 A |
| 5,566,204 A | | 10/1996 | Kardontchik et al. | 375/219 |
| 5,608,357 A | | 3/1997 | Ta et al. | 331/57 |
| 5,757,857 A | * | 5/1998 | Buchwald | 375/271 |
| 5,822,383 A | | 10/1998 | Muntz et al. | 375/362 |
| 5,889,828 A | * | 3/1999 | Miyashita et al. | 375/374 |
| 5,896,427 A | | 4/1999 | Muntz et al. | 375/372 |
| 6,005,904 A | * | 12/1999 | Knapp et al. | 375/376 |
| 6,055,286 A | * | 4/2000 | Wu et al. | 375/375 |
| 6,411,665 B1 | * | 6/2002 | Chan et al. | 375/360 |
| 6,560,305 B1 | * | 5/2003 | Croughwell | 375/376 |

* cited by examiner

*Primary Examiner*—Stephen Chin
*Assistant Examiner*—Curtis Odom
(74) *Attorney, Agent, or Firm*—Kent Daniels; Ogilvy Renault

(57) ABSTRACT

A system for recovering a clock signal from a data signal is described. The system uses an oscillator adapted to generate an oscillator output signal, a first detecting circuit for obtaining a coarse frequency-lock condition between the data signal and a recovered clock signal, a second detecting circuit for obtaining a phase-locked condition between the data signal and the recovered clock signal, a lock-detecting circuit responsive to the first detecting circuit for detecting an out-of-lock condition between the data signal and the recovered clock signal, and a control circuit responsive to the lock-detecting circuits and adapted to control the oscillator to generate an oscillator output signal on the basis of the first detecting circuit during an out-of-lock condition, and otherwise to generate the oscillator output signal on the basis of the second detecting circuit. The advantages include a much wider pull-in range for frequency acquisition, and an accurate and robust measure of a quality of received data.

74 Claims, 12 Drawing Sheets

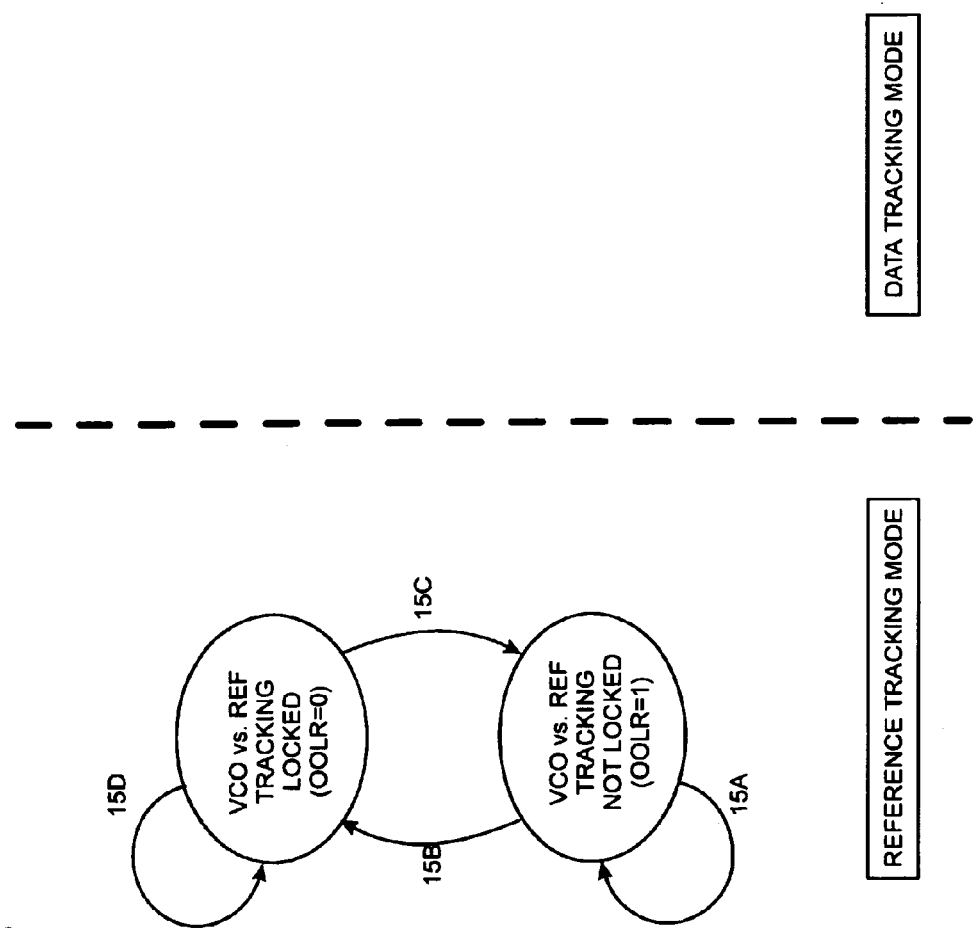

METHOD AND APPARATUS FOR CLOCK RECOVERY AND DATA QUALIFICATION

CROSS-REFERENCE TO RELATED APPLICATIONS

This is the first application filed for the present invention.

MICROFICHE APPENDIX

Not Applicable.

TECHNICAL FIELD

The present invention relates to data transmission systems, and in particular to a method and apparatus for recovering a clock signal from a received data signal, with simultaneous qualification of the received data signal.

BACKGROUND OF THE INVENTION

In digital transmission systems it is desirable to recover a clock signal from an incoming data stream and use that clock to re-time the received data. Ideally, this recovered clock is frequency locked to the data line rate and exhibits no additional jitter.

Various techniques for accomplishing this result are taught in the prior art. Known clock recovery systems typically utilize a digital phase locked loop in which a phase detector compares the data signal to the recovered clock signal, and produces an error signal indicative of a phase and/or frequency difference between the data and recovered clock signals. The error signal is used to control a numerically or voltage controlled oscillator that generates the recovered clock signal. Typically, a frequency lock condition is detected by comparison between the recovered clock signal and a network reference clock signal. It is also common practice to arrange the phase locked loop such that the oscillator will generate a recovered clock signal frequency locked to the network reference clock in the absence of a received data signal.

The prior art clock recovery systems are capable of maintaining phase and frequency lock between the data signal (or reference clock signal) and the recovered clock signal (oscillator output) within the pull-in range of the phase locked loop. Typically, this pull-in range is on the order of 1000 parts per million (ppm), which is adequate for digital transmission protocols having a narrow tolerance in the acceptable line transmission rate. Thus the network reference clock can be set to the nominal line transmission rate defined for the transmission protocol, and the oscillator controlled to produce a recovered clock signal which is frequency locked to the network reference clock. When a data signal is subsequently received, its frequency (provided that it is within the defined tolerances for the particular transmission protocol) will be within the pull-in range of the phase-locked loop, so that the oscillator can be controlled to pull-in the recovered clock signal to achieve a phase and frequency locked condition with the data signal.

However, emerging digital transmission protocols have wide tolerances in the acceptable line rate, well beyond the pull-in range of conventional methods of clock recovery systems. Previous proposals for wide-band frequency acquisition do not meet the jitter requirements for large, cascaded networks. In addition, none of these prior art systems provides an accurate and robust measure of the quality of the data. Consequently, no assurance is given that the data signal has a fixed line transmission rate and is within the wide-band specification of the transmission protocol.

In some applications there are additional features which conventional clock recovery systems do not address. First, it is desirable to determine when a received data signal has failed, and subsequently lock the oscillator to a fixed frequency until the data signal has recovered. Second, while the frequency is fixed, it is necessary to determine when the data signal has recovered and subsequently allow the recovered clock signal to track the data. Finally, it is desirable for the clock recovery unit to be able to pull-in to any frequency within a broad range. Conventional clock recovery systems do not address these features.

Accordingly, there remains a need for a clock recovery unit (CRU) that enables phase and frequency pull-in to data signals, the CRU having wide tolerances in acceptable line transmission rate, as well as protocol-independent detection of data signal failure and recovery.

SUMMARY OF THE INVENTION

An object of the present invention is to provide a clock recovery unit that is capable of determining when a data stream has failed, and detecting when the data stream has recovered using a fixed frequency source, while simultaneously providing a fixed frequency output.

Accordingly, one aspect of the present invention provides a system for recovering a clock signal from a data signal. The system comprises: an oscillator adapted to generate an oscillator output signal; first detecting means for obtaining a coarse frequency-lock condition between the data signal and a recovered clock signal; second detecting means for obtaining a phase-locked condition between the data signal and the recovered clock signal; lock-detecting means responsive to the first detecting means for detecting an out-of-lock condition between the data signal and the recovered clock signal; and control means responsive to the lock-detecting means and adapted to control the oscillator to generate an oscillator output signal on the basis of the first detecting means during an out-of-lock condition, and otherwise to generate the oscillator output signal on the basis of the second detecting means.

In a preferred embodiment of the invention, the first detecting means comprises a digital frequency detector adapted to generate a frequency error signal indicative of a detected frequency difference between the data signal and the oscillator output signal.

In the preferred embodiment of the invention, the second detecting means comprises a phase detector adapted to generate a phase error signal indicative of a detected phase difference between the data signal and the oscillator output signal.

In the preferred embodiment of the invention, the lock-detecting means comprises a frequency lock detector responsive to the digital frequency detector and adapted to generate a lock-indicator signal indicative of a frequency-lock condition between the data signal and the oscillator output signal.

In the preferred embodiment of the invention, the control means comprises: a state machine responsive to the lock-indicator signal and adapted to generate a control signal; and selection means responsive to the control signal and adapted to selectively enable control of the oscillator by either the first or second detector means.

A further aspect of the present invention provides a digital frequency detector for detecting a difference between a frequency of an oscillator output signal and a frequency of a data signal. The digital frequency detector comprises: first digital sample means for sampling the oscillator output signal at a timing of the data signal to generate a first beat signal; second digital sample means for sampling a quadrature clock signal at a timing of the data signal to generate a second beat signal; and third digital sample means for sampling the second beat signal at a timing of the first beat signal to generate a frequency error signal.

In a preferred embodiment of the invention, a frequency of the quadrature clock signal is substantially identical to that of the oscillator output signal, and a phase difference between the quadrature clock signal and the oscillator output signal is between about 45° and 135°. Preferably, the phase difference between the quadrature clock signal and the oscillator output signal is approximately 90°.

The first sample means preferably comprises a first pair of digital latch circuits respectively adapted to sample the oscillator output signal on rising and falling edges of the data signal; and, a first multiplexor adapted to selectively switch between respective outputs of the first pair of digital latch circuits on transitions of the data signal.

The second sample means preferably comprises a second pair of digital latch circuits respectively adapted to sample the quadrature clock signal on rising and falling edges of the data signal; and, a second multiplexor adapted to selectively switch between respective outputs of the second pair of digital latch circuits on transitions of the data signal.

The frequency error signal is preferably a differential signal comprising a complementary pair of first and second error signals, a difference between values of the first and second error signals indicating a frequency difference between the recovered clock signal and the data signal.

The third sample means preferably comprises a first digital flip-flop circuit adapted to sample the second beat signal on rising edges of the first beat signal; a second digital flip-flop circuit adapted to sample the second beat signal on falling edges of the first beat signal; a first logic gate adapted to output the first error signal when both the first beat signal and an output of the first digital flip-flop circuit are at a logical high level; and, a second logic gate adapted to output the second error signal when the first beat signal is at a logical low level and an output of the second digital flip-flop circuit is at a logical high level. Preferably the first and second logic gates are logical-NOR gates.

The third sample means preferably further comprises a digital delay circuit adapted to delay the first beat signal with respect to the second beat signal by a predetermined delay period, whereby a delayed first beat signal is supplied to the first and second digital flip-flop circuits and the first and second logic gates. Preferably, the predetermined delay period is sufficiently long to permit the second beat signal to settle at respective inputs of the first and second digital flip-flop circuits. In addition, the predetermined delay period preferably is less than a period of the oscillator output signal.

The frequency lock indicator means preferably comprises counter means for counting, during a predetermined sample period, transitions of either one of the second beat signal and a third beat signal; and comparing means for comparing the counted number of transitions to a predetermined threshold value, and for generating the lock-indicator signal based on a result of the comparison. Preferably, the predetermined sample period is selected to define a maximum detectable frequency difference between the oscillator output signal and the data signal.

The third beat signal is preferably generated by fourth sample means adapted to alternately sample respective outputs of each of the first and second digital flip-flop circuits at a timing of transitions of the first beat signal. Preferably, the fourth sample means comprises a third multiplexor adapted to selectively switch between respective outputs of the first and second digital flip-flop circuits on transitions of the first beat signal.

The comparing means is preferably adapted to generate a value of the lock-indicator signal indicative of an in-lock condition when the counted number of transitions is less than the predetermined threshold value, and is adapted to generate a value of the lock-indicator signal indicative of an out-of-lock condition when the counted number of transitions is equal to or greater than the predetermined threshold value. Preferably, the predetermined threshold value is selected such that, in an in-lock condition, a residual frequency difference between the oscillator output signal and the data signal is within a pull-in range of a conventional phase detector circuit.

The state machine preferably comprises monitor means adapted to sample successive values of the lock-indicator signal. The state machine is responsive to the monitor means and adapted to transition to a data-not-qualified state when a density of sampled values of the lock-indicator signal indicative of an out-of-lock condition exceeds a predetermined density tolerance. The state machine transitions to a data-qualified state if a predetermined number of consecutive sampled values of the lock-indicator signal are indicative of an in-lock condition. Preferably, the predetermined density tolerance is 50% and the predetermined number is 1.

In embodiments of the invention, the data lock indicator means is a fixed window phase lock indicator adapted to generate the lock-indicator signal on a basis of a proportion of time, in relation to the predetermined sample period, for which the second beat signal is at a logical-low level. In the preferred embodiment, the fixed window phase lock indicator comprises means for generating a reset signal at a timing of the predetermined sample period; and an N-bit counter adapted to count bits of the oscillator output signal while the second beat signal is at a logical-low level, generate an over-flow signal indicative of an over-flow state of the N-bit counter, and reset a counted number of bits to zero upon receipt of the reset signal. Preferably, the means for generating a reset signal comprises a $2^M$ frequency divider adapted to generate the reset signal by frequency-division of the oscillator output signal. The values of N and M are preferably selected to provide desired noise-rejection properties of the data lock indicator means.

The fixed window phase lock indicator is preferably adapted to assert a value of the lock-indicator signal indicative of an out-of-lock condition when a value of the over-flow signal indicates that the N-bit counter is in an over-flow state, and otherwise assert a value of the lock-indicator signal indicative of an in-lock condition.

The fixed window phase lock indicator preferably further comprises: a third digital flip-flop circuit adapted to sample the over-flow signal at a timing of the reset signal; and a logical-OR gate adapted to assert a value of the lock-indicator signal corresponding to a value of one of the over-flow signal and an output of the third digital flip-flop circuit.

In embodiments of the invention, the data lock indicator means is a sliding window phase lock indicator adapted to generate the lock-indicator signal on a basis of a series of N consecutive samples of the second beat signal. Preferably, the sliding window phase lock indicator is adapted to assert a value of the lock-indicator signal indicative of an out-of-lock condition if at least 2 out of N+1 consecutive samples of the second beat signal are at a logical low value, and assert a value of the lock-indicator signal indicative of an in-lock condition if at least N consecutive samples of the second beat signal are at a logical high value.

The sliding window phase lock indicator preferably comprises an input digital flip-flop circuit adapted to sample the second beat signal at a timing of a predetermined sample period; an N-bit shift register connected to the input digital flip-flop circuit and adapted to store N consecutive samples of the second beat signal; a first logic gate adapted to assert a high value of a first gate output signal when at least one of the N bits of the shift register, and an output of the input digital flip-flop circuit are at a low value; a second logic gate adapted to assert a high value of a second gate output signal when all N bits of the shift register are at a high value; and, an output digital flip-flop circuit adapted to assert a value of the lock-indicator signal based on the first and second gate output signals.

The present invention provides protocol-independent (i.e. generic) frequency acquisition and data qualification for serial data communications systems, and maintains the timing integrity (e.g. low jitter) of existing solutions.

BRIEF DESCRIPTION OF THE DRAWINGS

Further features and advantages of the present invention will become apparent from the following detailed description, taken in combination with the appended drawings, in which:

FIG. 15 is a state diagram schematically illustrating a clock synthesizer mode of operation of the embodiment shown in FIG. 1.

It should be noted that throughout the appended drawings, like features are identified by like reference numerals.

DETAILED DESCRIPTION OF THE PREFERRED EMBODIMENT

Figure 1:
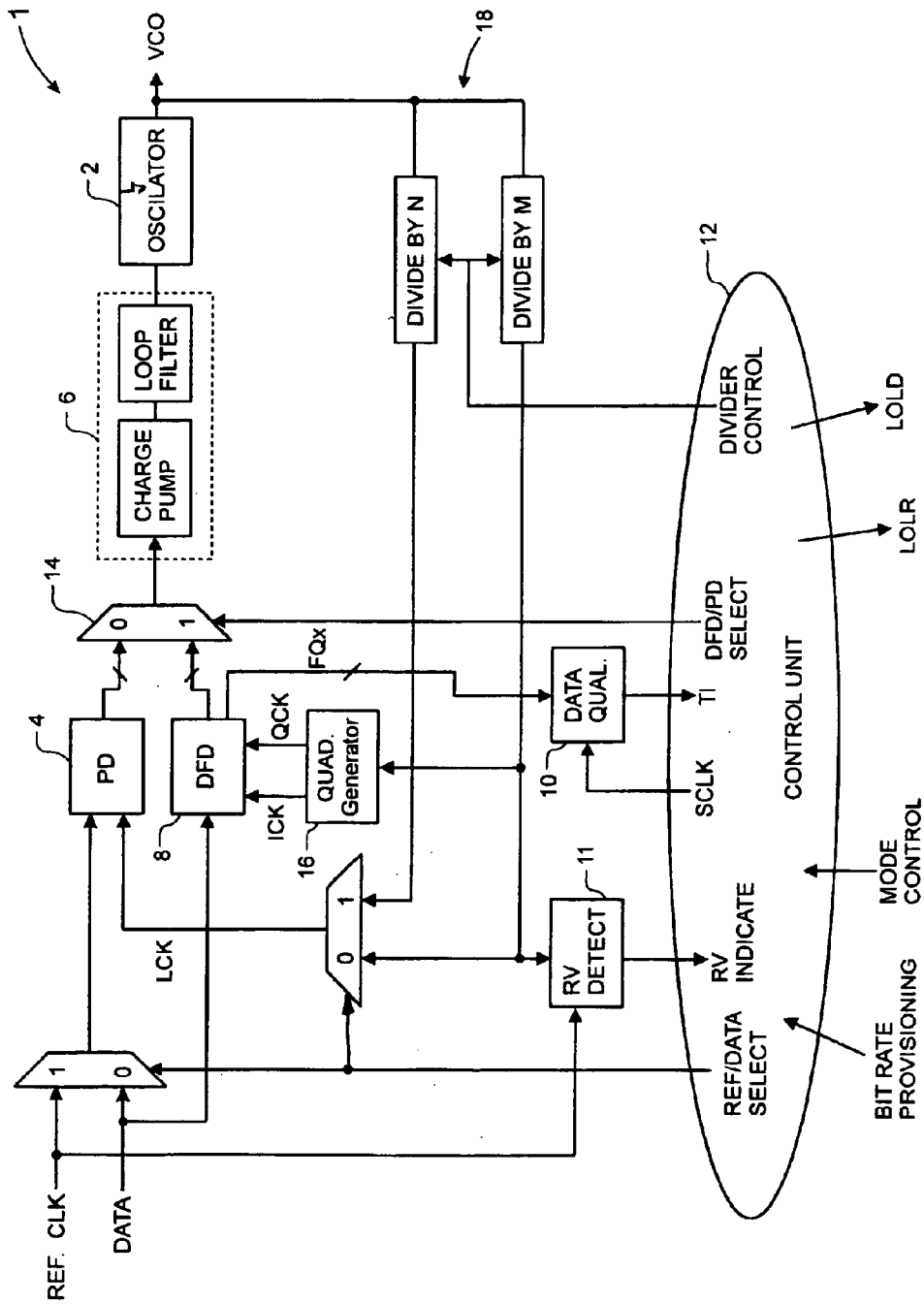
FIG. 1 is a block diagram schematically illustrating a clock recovery unit in accordance with an embodiment of the present invention.

The present invention provides a clock recovery unit (CRU) 1 for recovering a clock signal from a data signal (DATA). As shown in FIG. 1, the CRU 1 includes an oscillator 2 that generates a recovered clock signal as an oscillator output signal (VCO); a phase detector 4 that generates a phase error signal indicative of a detected phase difference between the data signal and the oscillator output signal; an oscillator controller 6 for controlling the oscillator 2; a digital frequency detector 8 arranged to generate a frequency error signal indicative of a detected frequency difference between the DATA signal and VCO; a data qualification circuit 10 for detecting a valid data signal and a frequency lock condition between DATA and VCO; a conventional reference detection circuit 11 for detecting a frequency lock condition between a reference clock signal REF CLK and VCO; and, a control unit 12 that includes a state machine for controlling the operation of the CRU 1 and for indicating an in-lock or out-of-lock state of the CRU 1.

The digital frequency detector (DFD) 8 of the CRU 1 serves as a frequency acquisition unit to perform frequency lock on data rates which fall outside of the (conventional) pull-in range of the phase detector (PD) 4. The DFD 8 performs well as a frequency acquisition unit, but has poor noise immunity, non-linear gain, and characteristic pattern dependency that make it a poor phase detector. Accordingly, once the data frequency has been acquired, the PD 4 is used to maintain oscillator output signal (VCO) phase lock with the data signal. A multiplexor 14 switches the oscillator 2 frequency control between the DFD 8 and the PD 4.

The DFD 8 of the preferred embodiment of the invention requires two clock input signals, an in-phase clock (ICK) signal and a quadrature clock (QCK) signal. To facilitate proper operation of DFD 8, a quadrature clock signal generator 16 generates both of the digital clock signals (ICK and QCK) from a VCO feedback circuit 18. For purposes of phase lock detection, ICK and a line clock (LCK) that drives the PD 4, should have substantially zero phase skew.

In the embodiment shown in FIG. 1, data signal qualification and frequency lock detection are handled by the data qualification circuit 10. The data qualification circuit 10 is differentiated from conventional monitoring circuits in that comparisons of the DATA and VCO frequencies can be made quantitatively, even when the oscillator 2 is being controlled on the basis of signals generated by the PD 4. Conventional clock recovery methods are not adapted to determine a quality of the data signal. That is, a valid data signal cannot be differentiated from broadband noise. One protocol independent indication of a valid data signal is bit rate. Thus the data qualification circuit 10 uses a quantitative assessment of the data signal bit rate to determine whether a valid data signal is present.

The control unit 12 implements the application state machines described below. The control unit 12 controls the CRU 1. Provisioning for the mode of operation and intended bit rate (for a particular transmission protocol) are provided externally according to system requirements. Loss of lock indicators for REF CLK-to-VCO and DATA-to-VCO (LOLR and LOLD respectively) are provided by the control unit 12 for external processing. These signals are generated by debouncing the reference clock and data signal out-of-lock indicators (LOLR and LOLD) defined below in the application state machines.

Figure 2:
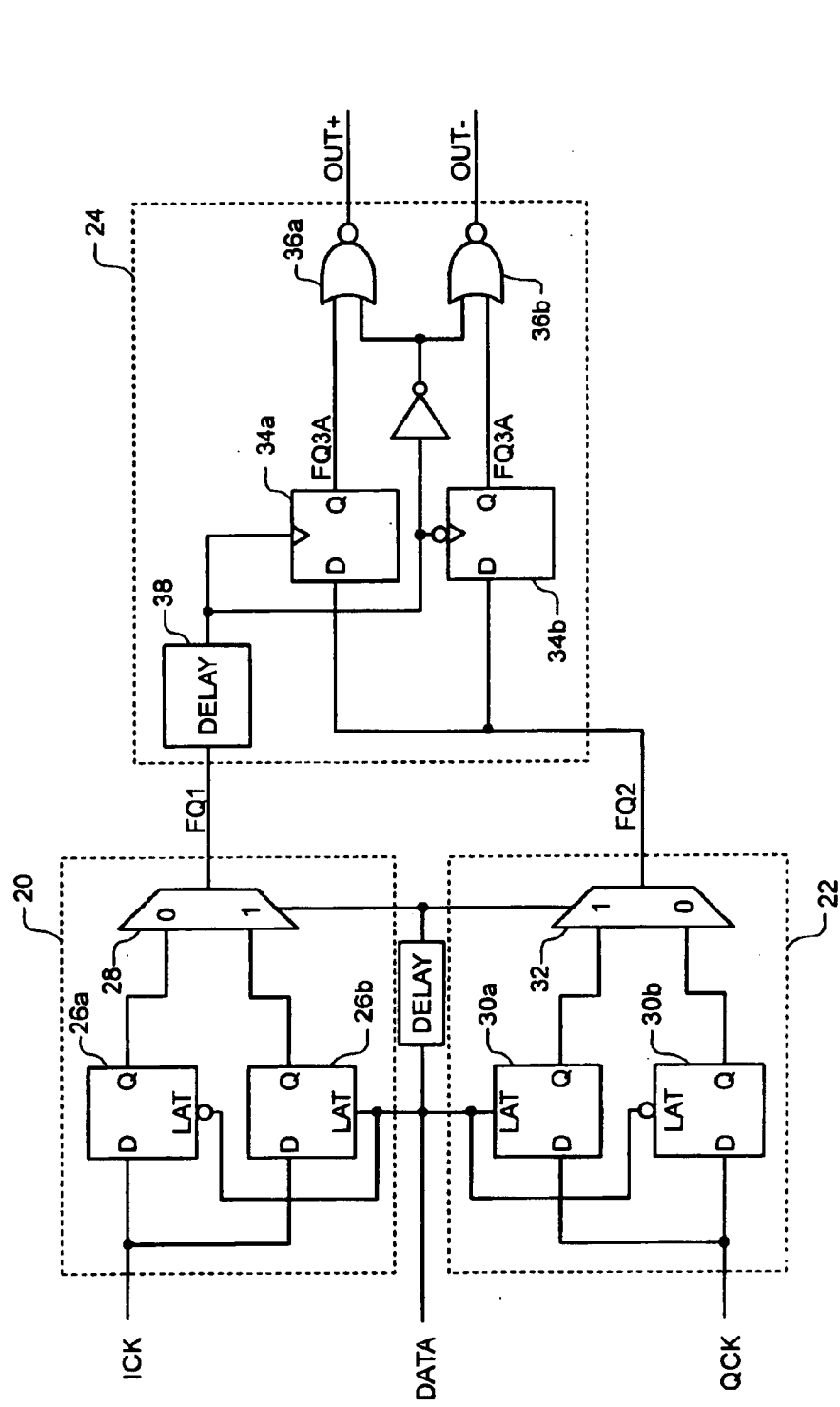
FIG. 2 is a circuit diagram schematically illustrating a digital frequency detector usable in the embodiment shown in FIG. 1.

As shown in FIG. 2, the DFD 8 is a quadri-correlator similar to a known Pottbacker-Langmann-Schreiber phase detector (A. Pottbdcker, U. Langmann, H. Schrieber, "An 8 GHz Silicon Bipolar Clock Recovery and Data Regenerator IC", IEEE Journal of Solid-State Circuits, Vol. 29, No. 12, December 1994.), with the exception that it is a fully digital implementation. Unlike the Pottbacker-Langmann-Schreiber phase detector, the DFD 8 does not perform or require phase detection.

The DFD 8 is based on the concept of a quadri-correlator with differential outputs (OUT+ and OUT−) that represent a frequency difference between the data signal and VCO frequency ($\Delta f_{DV}$), where $\Delta f_{DV}$ is equal to $f_{DATA}$ minus $f_{VCD}$. As shown in FIG. 2, the DFD 8 generally comprises a first sampling circuit 20 which samples the in-phase clock (ICK) at a timing of the data signal to produce a first beat signal FQ1; a second sampling circuit 22 for sampling the quadrature clock (QCK) at a timing of the data signal to produce a second beat signal FQ2; and, a third sampling circuit 24 for sampling FQ2 at a timing of FQ1 to produce the differential outputs OUT+ and OUT−.

The first sampling circuit 20 comprises a set of D-type latches 26a,b respectively clocked with the data signal and its complement (i.e. an inverted data signal). The outputs of these latches 26a,b are presented to a multiplexor 28, which is switched by the data signal. The resulting first beat signal, FQ1, is composed of ICK sampled at each transition of the data signal.

Similarly, the second sampling circuit 22 comprises a pair of D-type latches 30a,b respectively clocked with the data signal and its complement. The outputs of these latches 30a,b are presented to a multiplexor 32, which is switched by the data signal. The resulting second beat signal, FQ2, is composed of QCK sampled at each transition of the data signal. FQ1 and FQ2 collectively indicate a frequency difference between the data signal and VCO. Note that during zero frequency difference (hence frequency lock is obtained), FQ2 is high, assuming the appropriate phase relationship is maintained between ICK and LCK. Two timing diagrams shown in FIGS. 3a and 3b, illustrate FQ1 and FQ2 when $\Delta f_{DV}<0$ and $\Delta f_{DV}>0$ respectively.

As shown in FIG. 2, the third sampling circuit 24 includes a set of digital flip-flop circuits 34a,b which are connected to receive FQ2 at their respective data input ports, and are respectively clocked by FQ1 and its complement. The outputs from the digital flip-flop circuits 34a,b are respectively supplied to a pair of logic gates 36a,b and combined with the complement of FQ1 to produce the differential output signals OUT+ and OUT−. If FQ2 is low and FQ1 transitions to a high logic state, OUT+ is driven high for the duration of the FQ1 pulse. If FQ1 transitions low, while FQ2 is low, OUT− is driven high for the duration of the FQ1 pulse. Note that FQ1 is delayed by a delay circuit 38 to ensure that the set-up time for the flip-flops 34a,b is not violated.

Figure 3A:
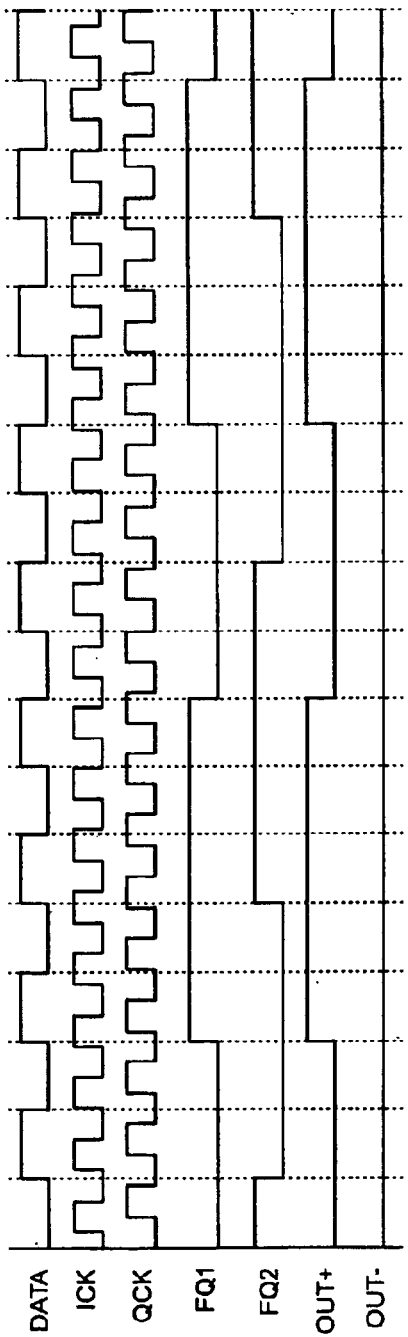
FIGS. 3a and 3b show respective timing diagrams illustrating the operation of the digital frequency detector shown in FIG. 2.
Figure 3B:
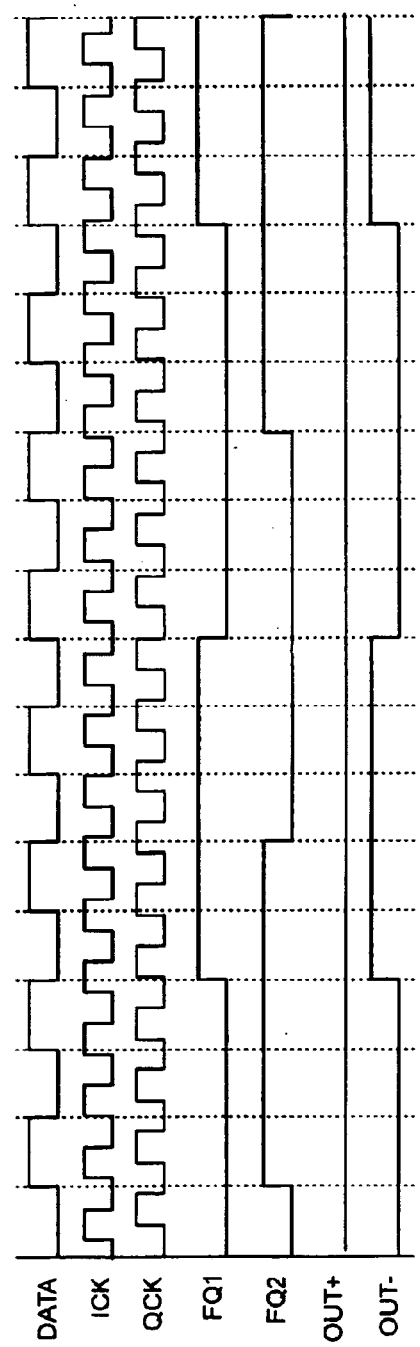

Table 1 shows exemplary logic states for the third sampling circuit 24 of the DFD 8, and the timing of these signals, relative to FQ1 and FQ2, is shown in FIG. 3a and FIG. 3b. There are four differential states defined by OUT+ and OUT−, of which: two are neutral; one increases VCO frequency; and one decreases VCO frequency. In the illustrated embodiment, when both OUT+ and OUT− are at the same level (either high or low) no change to VCO frequency is required. If OUT− is high, and OUT+ is low, VCO frequency is less than the data signal frequency, therefore VCO frequency must be increased. Conversely, when OUT+ is high, and OUT− is low, VCO frequency must be decreased.

TABLE 1

| FQ1 | FQ2 | OUT+ | OUT− |
|---|---|---|---|
| Rising Edge | 1 | 0 | 0 |
| Falling Edge | 1 | 0 | 0 |
| Rising Edge | 0 | 1 | 0 |
| Falling Edge | 0 | 0 | 1 |

The quadrature clock (QCK) is required by the DFD 8, which, when compared with the data signal frequency, produces the second beat signal (FQ2) for the purpose of frequency acquisition and data qualification. The quadrature clock (QCK) is a digital clock with the same frequency as ICK, but is phase shifted by nominally 90°.

Figure 4:
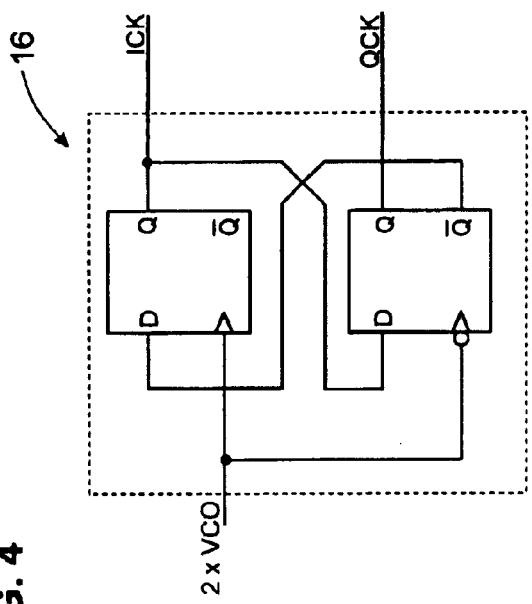
FIG. 4 is a block diagram schematically illustrating a quadrature clock generator usable in the embodiment shown in FIG. 1.

There are several methods of obtaining the quadrature clock QCK. One method is to implement an oscillator 2 which operates at twice the intended frequency, and use a clock divider circuit as shown in FIG. 4. This implementation may not be practical for all implementations. As line rates begin to approach the process limits, an oscillator 2 running at twice the line rate might not be practical or possible to implement. An alternative is to include a delay element that maintains a delay (not shown) equal to ¼ of the period of ICK. Several such static or adaptive delay element designs are known. However, this method is difficult to implement for applications that support multiple line rates and large frequency acquisition ranges.

Where the oscillator 2 is implemented as a 4-stage ring oscillator, ICK and QCK can be derived from the output of two of the stages.

The two beat signals, FQ1 and FQ2 give correlative information about a quadrature phase relationship between the data signal and VCO. Most importantly, when an absolute value of $\Delta f_{DV}$ is small, the period of FQ2 is approximately equal to the period of the frequency difference between VCO and the data signal, with a duty cycle that approaches 50%. Consequently, as VCO frequency approaches the data frequency, the period of FQ2 is extended, but is finite as long as $\Delta f_{DV}$ is non-zero. The data qualification circuit 10 exploits the periodicity of the FQ2 and FQ1 functions to quantitatively determine $\Delta f_{DV}$.

Figure 5:
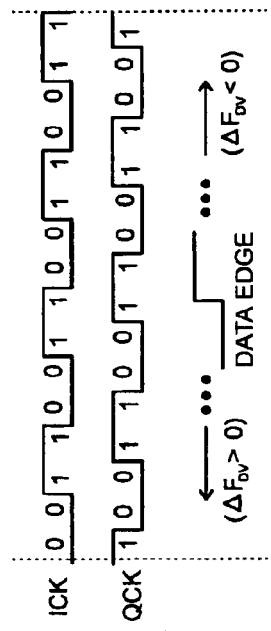
FIG. 5 is a timing diagram schematically illustrating a relationship between quadrature clock signals and the data signal.

FIG. 5 illustrates the relationship between the quadrature clock signals ICK, QCK, the DATA signal, and the beat signals FQ1 and FQ2. When the DATA signal frequency is lower than VCO frequency (i.e. $\Delta f_{DV}<0$), the data edges move to the right with respect to ICK and QCK. In this case, FQ1,FQ2 pairs transition sequentially from 0,1 to 0,0 to 1,0 to 1,1. When the data signal frequency is greater than VCO frequency ($\Delta f_{DV}>0$), the data edges move to the left with respect to ICK and QCK. Thus, FQ1,FQ2 pairs transition sequentially from 0,1 to 1,1 to 1,0 to 0,0.

Figure 6:
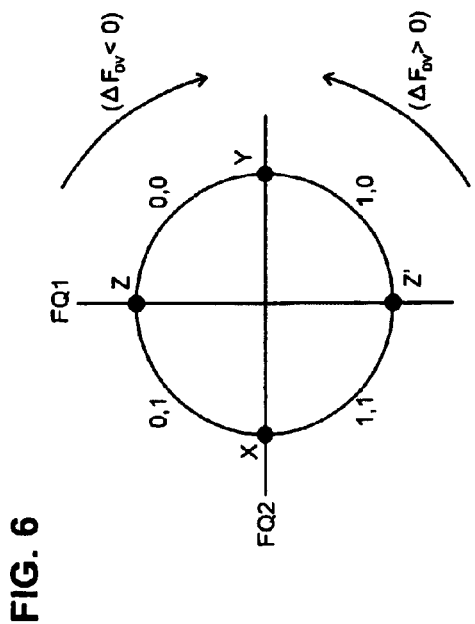
FIG. 6 is a polar state diagram for describing the signal relationships shown in FIG. 5.

Due to the cyclical nature of these transitions, the relationship between FQ1, FQ2, and $\Delta f_{DV}$ is best explained by a polar state diagram, shown in FIG. 6. Note that for $\Delta f_{DV}<0$, and constant, the states transition at a constant radial velocity in a clockwise direction. Similarly, for $\Delta f_{DV}>0$ states transition in counter-clockwise direction. In either condition, for small $\Delta f_{DV}$, the number of rotations about the axis of the state diagram in a given sample period has a positive correlation with the absolute value of $\Delta f_{DV}$. Note that for data signal qualification the direction of the rotation is not important.

Two points of interest on the polar state diagram (see FIG. 6) are X and Y. X is the location at which, under ideal (meaning noise-free) conditions $\Delta f_{DV}$ equals zero, indicating that phase lock has been achieved. Without interruption, this state will be stable, and FQ2 will remain high indefinitely. When $\Delta f_{DV}$ is non-zero, a VCO control signal is determined as the state transitions through point Y, with polarity of the control signal dependent on the direction of rotation. In the preferred embodiment shown in FIG. 1, VCO is only adjusted when the DFD 8 is selected by control unit 12 to control the oscillator 2. The locations of X and Y shown in FIG. 6 assume that the appropriate phase relationship, as discussed earlier, between ICK and LCK is maintained. A different phase relationship would change the locations of X and Y on the polar state diagram. Frequency lock detection and data qualification can be performed as long as there is between about 45° and about 135° phase difference between ICK and QCK.

Under ideal conditions, $\Delta f_{DV}$ estimation can be performed by counting the number of FQ2 transitions in a given sample period. Using this technique is accurate, however it is impractical as ideal circumstances cannot be assumed. For low frequency offsets, relative to VCO frequency, noise may cause spurious FQ2 transitions, this is especially evident at Z and Z' (see FIG. 6), where the state bounces between quadrants 1 and 2, and quadrants 3 and 4, respectively. Using FQ1 in conjunction with FQ2, it is possible to determine when a complete rotation has occurred under practical (i.e. non-ideal) operating conditions.

Figure 7:
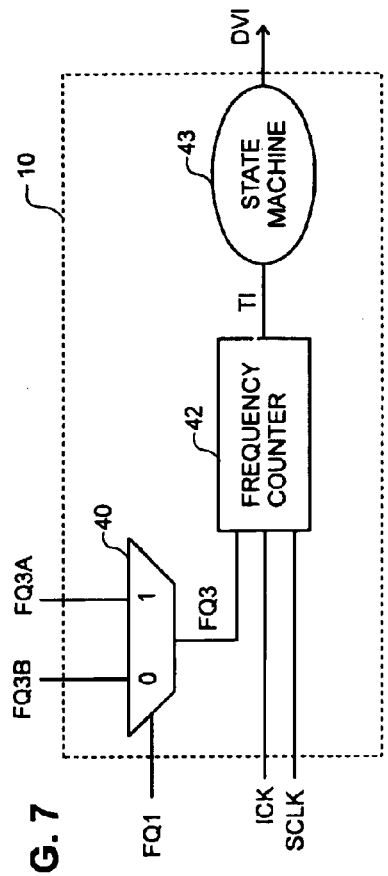
FIG. 7 is a block diagram schematically illustrating a generalized frequency lock detector circuit usable in the embodiment shown in FIG. 1.

A preferred embodiment for the data qualification circuit 10 is shown in FIG. 7. FQ3A and FQ3B are obtained from the third sampling circuit 24 of the DFD 8 (FIG. 2) and are the result of sampling FQ2 on the rising and falling edges of FQ1 respectively. A signal FQ3 is generated by selecting FQ3A and FQ3B using a multiplexor 40 as a fourth sampling circuit, with channel selection performed using FQ1. A frequency counter 42 is used to quantify the frequency difference $\Delta f_{DV}$ between the data signal and VCO. In general, frequency counter 42 counts the number of FQ3 edges within one period of a sample clock (SCLK). If N or more FQ3 transitions occur, where N is defined as a scaling factor (which is described below), then $\Delta f_{DV}$ is greater than the required threshold. The threshold indicator (TI) is driven low as a result of this event. If less than N FQ3 transitions occur within the SCLK period, then $\Delta f_{DV}$ is less than the required threshold, and TI is driven high. In this context, the threshold is a frequency difference defined as a function of the SCLK period and the scaling factor, N. The threshold can be any suitable selected value, and may vary with the state of the state machine. For example, for DATA-to-VCO tracking, the threshold may be selected such than when $\Delta f_{DV}$ is less than the threshold, then $\Delta f_{DV}$ is within the pull-in range of the PD 4, thereby allowing VCO frequency control to be switched from the DFD 8 to the PD 4.

During frequency acquisition, or phase lock, spurious events due to system noise, data pattern, or transmission non-linearities could cause spurious state transitions. Preferably, such temporary and isolated incidents should not switch VCO frequency control from the PD 4 back to the DFD 8, because the phase lock characteristics of the CRU 1 would then be compromised. The data qualification circuit 10 of the present invention therefore preferably rejects the spurious transitions described above. However, spurious state transitions may resemble rotations, thus further debouncing of TI is required. This function is performed by a debounce state machine 43.

There are many possible implementations for the frequency counter 42 in the data qualification circuit 10, that will meet the functional requirements described above. One possible implementation is a synchronous implementation with single-edge detection on FQ3 and SCLK. In the implementation shown in FIG. 8, the threshold frequency is defined by ($N \times f_{SCLK}$), where $f_{SCLK}$ is the frequency of the sample clock SCLK. Thus it is possible to control the level of the threshold frequency by varying $f_{SCLK}$.

Figure 8:
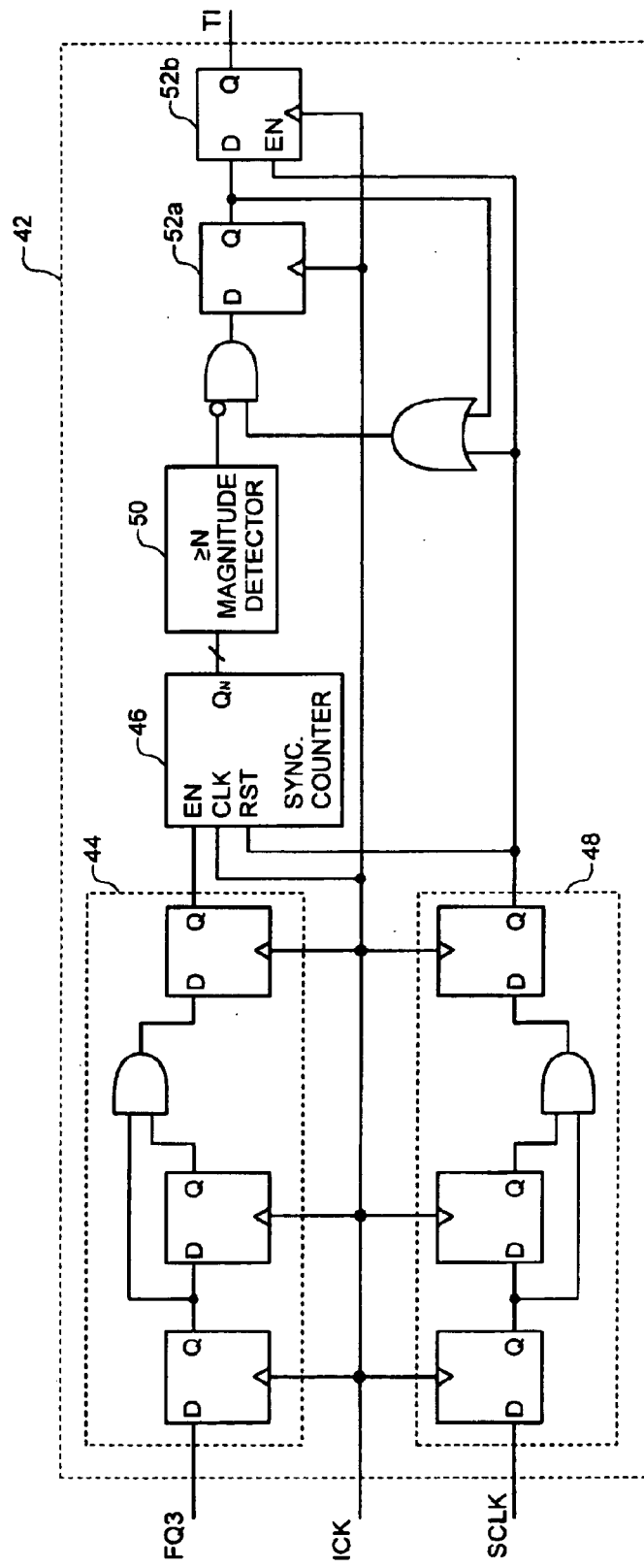
FIG. 8 is a block diagram schematically illustrating a synchronous frequency counter circuit usable in the generalized frequency lock detector circuit shown in FIG. 7.

As shown in FIG. 8, an exemplary implementation of the frequency counter 42 comprises a first edge detector circuit 44 which samples rising edges of FQ3 to produce a pulse train that is supplied to the enable input of a synchronous counter 46. A second edge detector circuit 48 samples rising edges of the sample clock SCLK to produce a periodic pulse train that is supplied to the reset input of the synchronous counter 46. The in-phase clock ICK is supplied to the clock input of the synchronous counter 46, so that the synchronous counter 46 will count edges of FQ3 between edges of SCLK. The output of the synchronous counter 46, which is the count value obtained between pulses derived from SCLK, is supplied to a magnitude detector 50 that compares the count value to the scaling factor N to produce the threshold indicator signal TI. As shown in FIG. 8, the threshold indicator signal TI may be sampled using a pair of digital flip-flop circuits 52a,b in order to ensure that the TI signal is asserted for at least a period $T_{SCLK}$ of the sample clock SCLK.

Depending on the design requirements for power consumption, footprint, and functionality, the frequency counter 42 can be implemented as any one of many variations. Simplifications might include fixing N to a multiple of 2 and removing the magnitude detector 50 in favor of an overflow bit on a standard synchronous counter. In this case, the threshold value is determined by the maximum count limit of the counter 46, and the overflow bit provides the value of the threshold indicator signal TI. In addition, the flip-flop 52a used to store the output of magnitude detector 50 can also be removed if the counter 46 is designed to saturate (overflow bit provides TI signal). Assuming that SCLK has a 50% duty cycle, it is also possible to use dual-edge detectors for FQ3 and SCLK (by replacing the AND gates shown in FIG. 8 with XOR gates).

Figure 9:
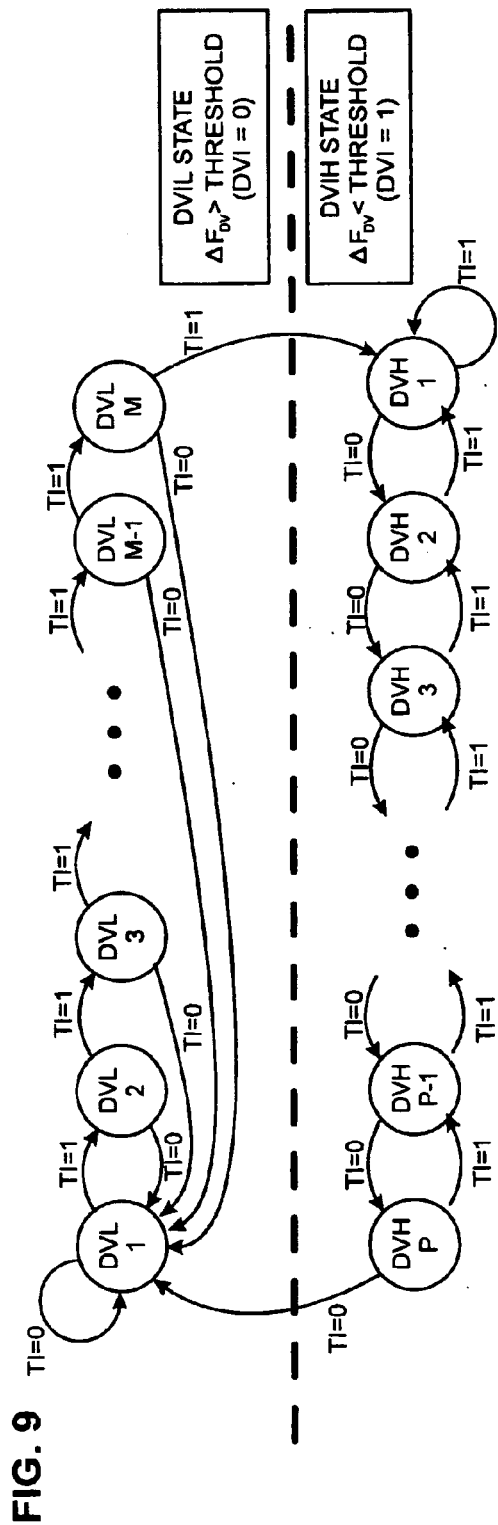
FIG. 9 is a logic diagram illustrating operations of a data qualification circuit state machine usable in conjunction with the frequency lock detector circuit shown in FIG. 7.

Debouncing of TI is handled in the debounce state machine 43, the states of which are shown in FIG. 9. As shown, there are two primary states: a DVIL state that indicates that $\Delta f_{DV}$ is greater than the threshold derived from N and SCLK; and a DVIH state in which $\Delta f_{DV}$ is less than the threshold. In each of these primary states there are multiple secondary states. Operation begins at DVL1, where $\Delta f_{DV}$ is greater than the threshold. If M consecutive TI samples are high, the state machine transitions to the DVIH state, and DVI transitions to a logic high. In most implementations, M will be one, however, M can be increased to improve resolution in $\Delta f_{DV}$ where a low frequency SCLK cannot be generated.

Once in the DVIH state, P secondary states are used for debouncing the TI signal. In the example of FIG. 9, P+Q (where Q is an integer) logic low samples of the TI signal are required in P+2Q sample periods for a primary state transition. Therefore, a logic low density greater than 50% will force the state machine 44 into the "DVIL state". For different low logic densities, secondary transitions can be changed to skip multiple secondary states for either TI polarity. Noise immunity is enabled because noise can cause multiple transitions in P consecutive samples without disrupting data qualification.

There are several alternative methods for data qualification, depending on the required capture range, noise immunity, and intended operation of the CRU 1. For example, in an alternative embodiment, FQ3 can be replaced with FQ2, thus removing the initial multiplexor stage. This will provide equivalent accuracy in the measurement of $\Delta f_{DV}$. However, without FQ1, incomplete rotations can be misinterpreted, thus lower noise immunity would result.

For applications in which phase lock is of primary importance and data qualification is less important, less robust circuits can be used. In this case, it is important to identify when $\Delta f_{DV}$ is zero. Under ideal circumstances, FQ2 and FQ1 will remain at or near position X on the polar state diagram (FIG. 6) and FQ2 remains high. In this case (i.e. under ideal conditions), any low going transition in FQ2 indicates a non-zero frequency difference between the DATA signal and VCO. Under non-ideal (e.g. realistic) conditions, noise may cause spurious transitions over the vertical axis, and the circuit must reject these transitions. There are many circuits that can be used to determine frequency lock using FQ2, two such examples are presented below. Note that this functionality is a subset of the functionality of the data qualification circuit 10 according to the preferred embodiment shown in FIGS. 7 and 8.

Figure 10:
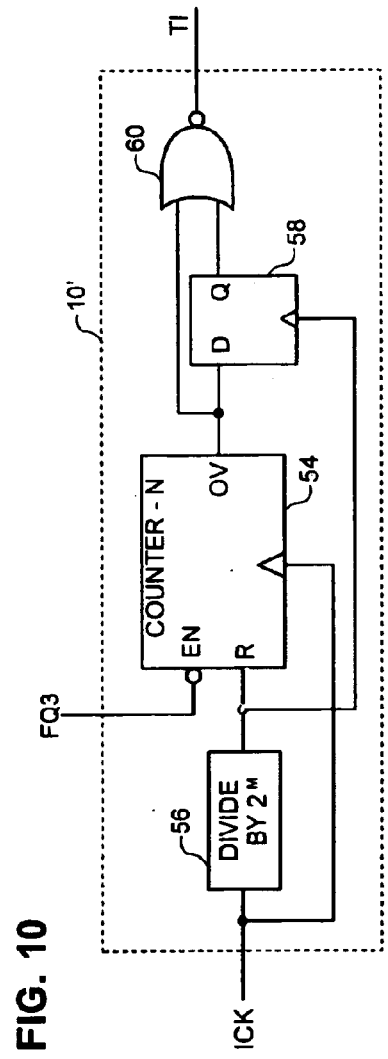
FIG. 10 is a block diagram schematically illustrating a fixed window phase lock detector usable in the frequency lock detection circuit shown in FIG. 7.

One alternative embodiment, shown in FIG. 10, is a fixed window phase lock indicator 10'. An N bit counter 54 is enabled whenever FQ2 is at a logic low level.

In the event that the counter 54 overflows before it is reset by the output of a $2^M$ clock divider 56, out-of-lock (OOL) is declared and the TI signal is asserted low. A digital flip-flop 58 and NOR logic gate 60 is added to ensure that TI is asserted low when the counter 54 overflows and remains in such a state for a period of at least $T_{ICK} \times 2^M$. Increasing M and N, while maintaining the same ratio, improves noise rejection. The percentage of the sampling period, defined by $2^M/\text{ICK}$, in which FQ2 can be low without declaring OOL is $2^{(N-M)}$. This implementation permits the TI signal to be used directly to drive the PD/DFD multiplexor 14 (FIG. 1). However, it is not limited to this application.

Figure 11:
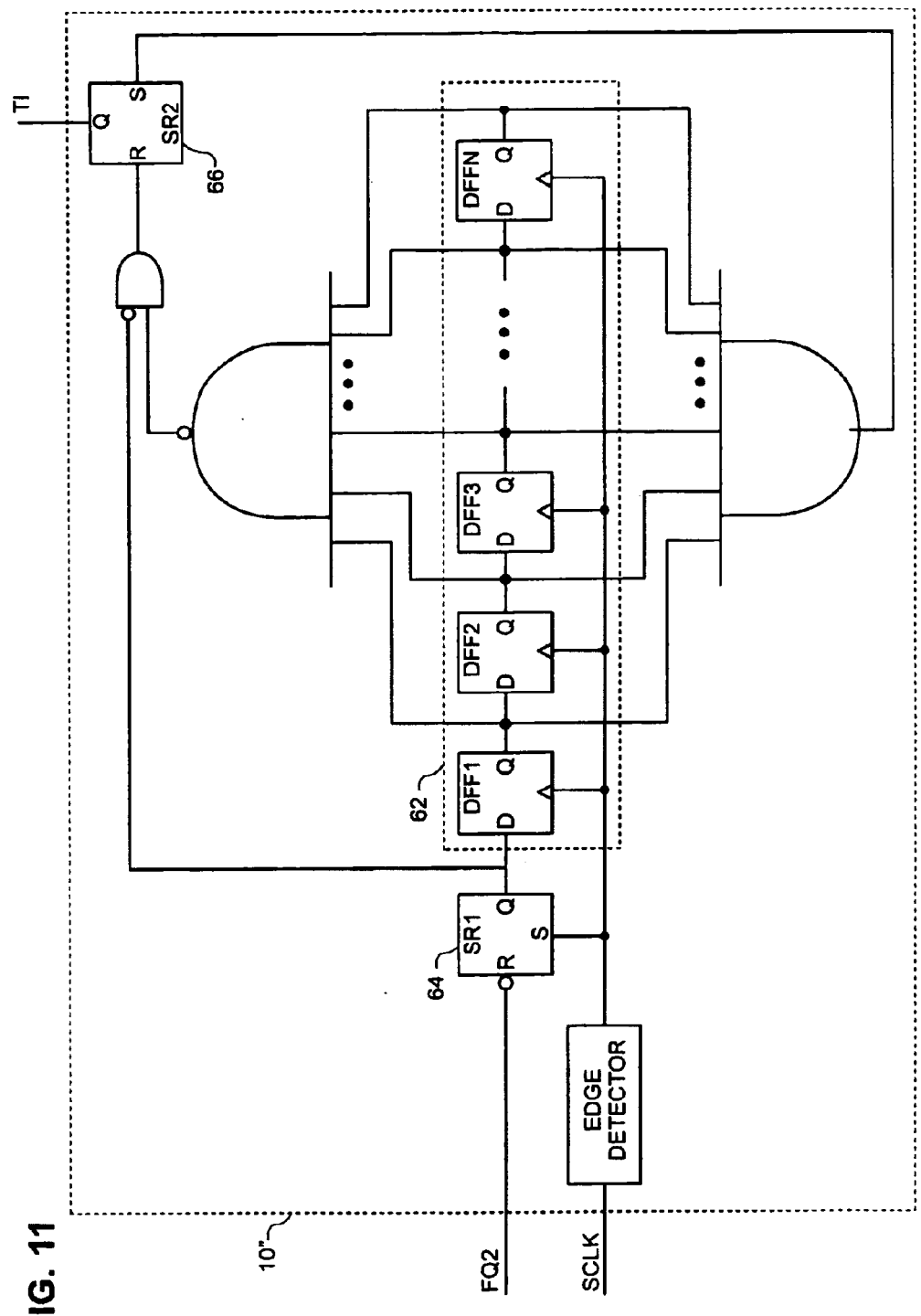
FIG. 11 is a circuit diagram schematically illustrating a sliding window phase lock detector usable in the frequency lock detection circuit shown in FIG. 7.

Another alternative embodiment, shown in FIG. 11, implements an N bit shift register 62 to capture consecutive samples of FQ2, and hence it is called a sliding window phase lock detector 10". If at least one falling transition of FQ2 occurs within X the period of SCLK, the output of an input flip-flop 64 is low. This event is then passed through the N-bit shift register 62 on succeeding transitions of SCLK. If FQ2 remains high (i.e. there are no transitions of FQ2) within a period of $½ \times N \times T_{SCLK}$, then an output flip-flop 66 is set and TI is asserted high, indicating that VCO signal is phase and frequency locked to the data. If in at least 2 of N+1 sample periods FQ2 is sampled low (i.e. the output of the input flip-flop 64, and at least one of the N bits of the shift register 62 are low), then the output flip-flop 66 is reset and TI is asserted low, indicating that VCO signal is not phase and frequency locked to the data. To debounce FQ2, 2 sample periods must have FQ2 logic low samples within $½ \times N \times T_{SCLK}$ before TI is asserted low. SCLK is intended to be a low speed clock (e.g. in the tens of MHz) which sets the minimum TI assertion/deassertion time. The operation of the sliding window phase lock detector 10m is highlighted in the following table:

| Condition | Operation |
|---|---|
| 2 of N + 1 samples of FQ2 are low (i.e. output of flip-flop 64 and one of the N bits of the shift register 62 are low) | TI asserted low (out-of-lock condition) |
| No samples of FQ2 in N sample periods are low (i.e. all N bits of the shift register 62 are high) | TI asserted high (in-lock condition) |
| Otherwise | TI does not change |

The hystersis of the sliding window phase lock detector 10, (i.e. the level of TI changes only when one of the first two conditions are positively present) provides rejection of spurious transitions of FQ2.

N is a degree of freedom that controls the percentage of low FQ2 samples that can be tolerated. Note that only N+2 high-speed flip-flops are required in this implementation, therefore total power consumption is reduced for equivalent functionality as compared to the previous alternative. This circuit can also be implemented using synchronous logic.

The CRU 1 of the present invention has many operational modes, determined by the configuration of the control unit 12. Four exemplary operational modes include:

Range Provisioned Frequency Lock Mode;

Provisioned Frequency Lock Mode;

Unprovisioned Frequency Lock Mode; and

Clock Synthesizer Mode.

Each of these four exemplary applications are described below. Note that in each mode, the level of the threshold frequency can be held constant, or may be varied (e.g. by suitably controlling the frequency $f_{SCLK}$ of the sample clock signal SCLK) for each of the modes and/or states.

Range Provisioned Frequency Lock Mode

Figure 12:
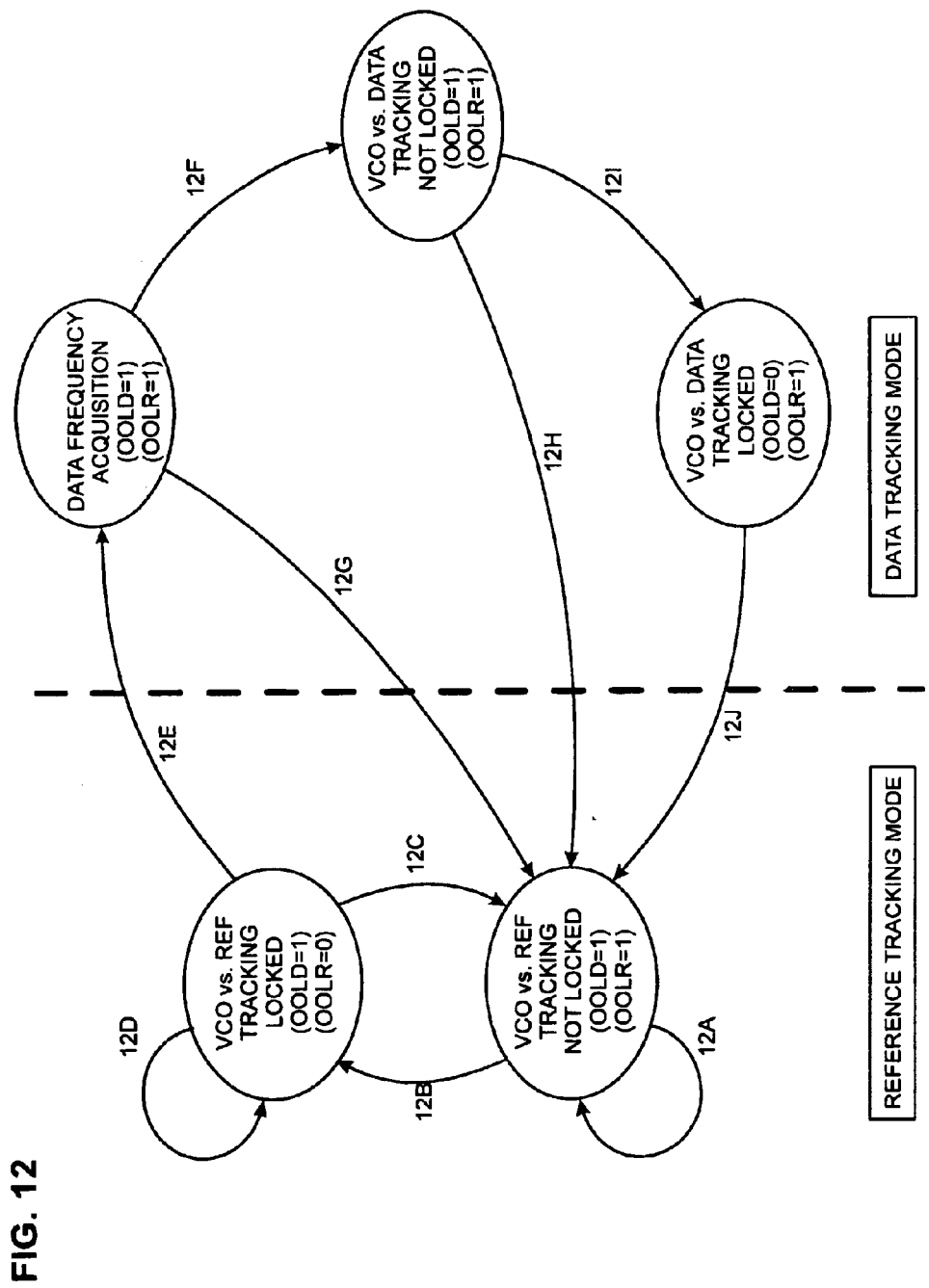
FIG. 12 is a state diagram schematically illustrating a range provisioned frequency lock mode of operation of the embodiment shown in FIG. 1.

The range provisioned frequency lock mode is a preferred application for the CRU 1. In this mode, the CRU 1 will tolerate data frequencies beyond the pull-in range of a standard phase detector. Operation begins in a reference tracking mode with the PD 4 controlling the oscillator 2 to lock to a supplied reference clock (REF CLK). When the difference between VCO and reference clock frequency ($\Delta f_{VR}$) is below a first predetermined threshold, "reference lock", is declared and the state machine 44 monitors VCO-to-data frequency agreement. For valid data, $\Delta f_{DV}$ reported by the data qualification circuit 10 is below a second predetermined threshold, and the CRU 1 switches to data tracking mode. In this mode the DFD 8 controls VCO frequency to reduce $\Delta f_{DV}$. When the data frequency has been acquired (i.e. $\Delta f_{DV} < N \times f_{SCLK}$) the PD 4 maintains VCO-to-DATA phase lock. The operation of this state machine is shown in FIG. 12. The control unit 12 output, OOLD, is only low when VCO is phase locked to the data signal and the data signal is deemed valid. Exemplary state transitions are as follows:

| Transition ID | Description | Condition | Action |
|---|---|---|---|
| 12A | VCO is not locked to the reference | $\Delta f_{VR}$ is greater than predetermined threshold ($P_{VR1}$) | PD 4 retains VCO control, VCO frequency tracked against reference clock |
| 12B | CRU 1 achieves VCO to reference clock lock | $\Delta f_{VR}$ is less than predetermined threshold ($P_{VR1}$) | PD 4 retains VCO control, data qualification begins, VCO frequency remains stable |
| 12C | CRU 1 loses VCO to reference clock lock | $\Delta f_{VR}$ is greater than predetermined threshold ($P_{VR1}$) | PD 4 retains VCO control, VCO frequency tracked against reference clock |
| 12D | CRU 1 maintains VCO to reference clock lock, but data is not valid | $\Delta f_{VR}$ is less than predetermined threshold ($P_{VR1}$) and $\Delta f_{DV}$ is greater than predetermined threshold ($P_{DV1}$) | PD 4 maintains VCO control, VCO frequency continues to track reference clock |
| 12E | CRU 1 maintains VCO to reference clock lock, and data is valid | $\Delta f_{VR}$ is less than predetermined threshold ($P_{VR1}$) and $\Delta f_{DV}$ is less than predetermined threshold ($P_{DV1}$) | VCO control switched to DFD 8, data frequency acquisition begins |
| 12F | Data is valid, coarse data frequency acquisition complete | $\Delta f_{VR}$ is less than predetermined threshold ($P_{DV2}$) | DFD 8 maintains VCO control, fine tuning for data frequency begins |
| 12G | Data is invalid | $\Delta f_{VR}$ is greater than predetermined threshold ($P_{VR2} = P_{DV1}$) | VCO control switched to PD4, reference frequency lock is required |
| 12H | Data is invalid | $\Delta f_{VR}$ is greater than predetermined threshold ($P_{VR2} = P_{DV1}$) | VCO control switched to PD4, reference frequency lock is required |
| 12I | Fine resolution data frequency lock is acquired | $\Delta f_{VR}$ is less than predetermined threshold ($P_{DV3}$) | VCO control is switched to PD 4 for phase lock to the data |
| 12J | VCO frequency and phase locked to data | $\Delta f_{VR}$ is less than predetermined threshold ($P_{DV3}$) | PD 4 retains control of VCO |
| 12K | Data is invalid | $\Delta f_{VR}$ is greater than predetermined threshold ($P_{VR2} = P_{DV1}$) or $\Delta f_{DV}$ is greater than predetermined threshold ($P_{DV3}$) | PD 4 begins reference lock |

Provisioned Frequency Lock Mode

Figure 13:
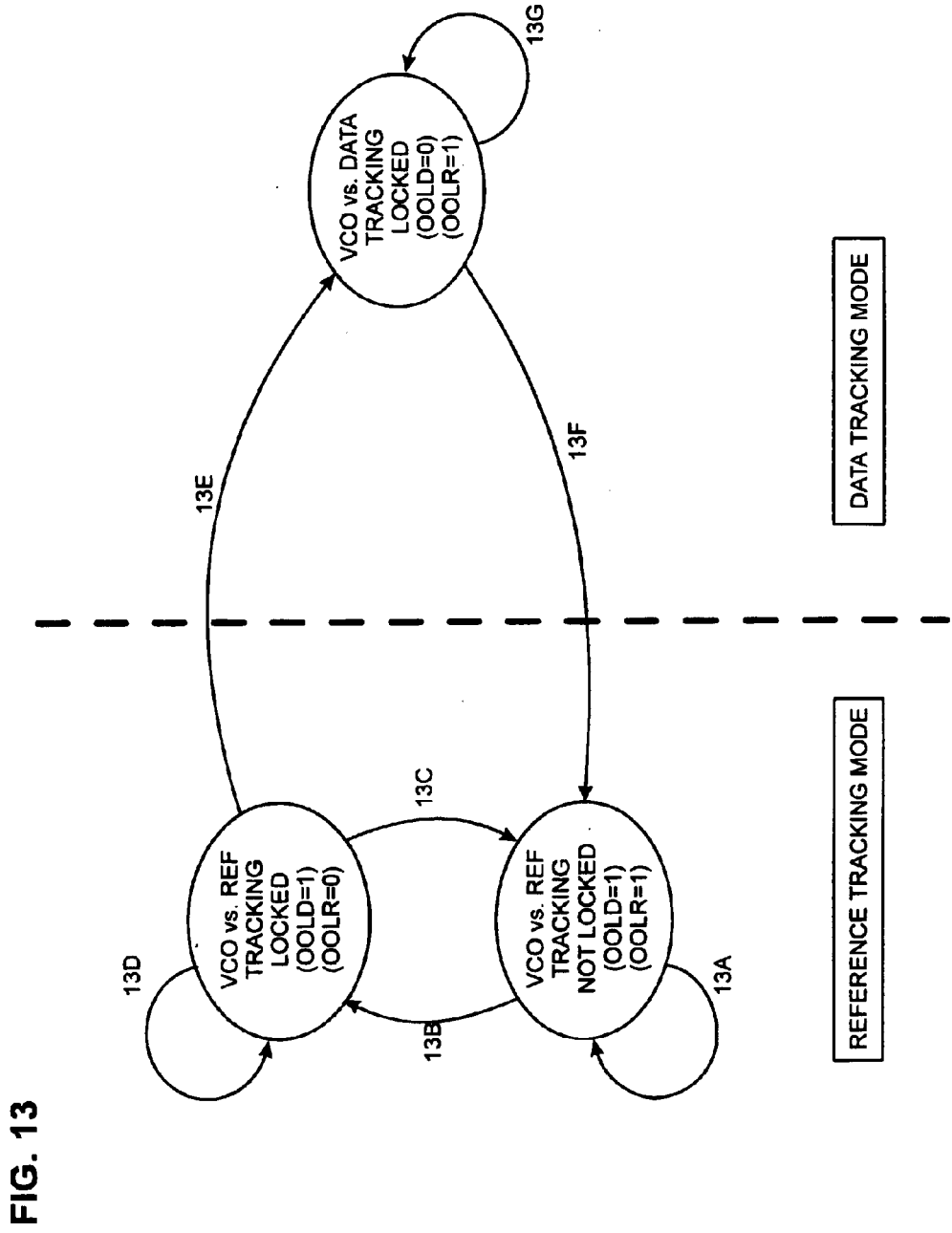
FIG. 13 is a state diagram schematically illustrating a provisioned frequency lock mode of operation of the embodiment shown in FIG. 1.

This application is very similar to conventional clock recovery systems, in that the data frequency is known, perhaps provisioned, and an appropriate reference clock is supplied. The illustrated embodiment adds the feature of data qualification which monitors $\Delta f_{VR}$ and $\Delta f_{DV}$ ensuring that frequency lock is maintained and valid data is received by the CRU 1. In this mode, the DFD 8 is never used for frequency acquisition, but remains enabled to provide input stimuli for the data qualification circuit 10. Details of this state machine are shown in FIG. 13. The control unit 12 output, OOLD, is low when VCO is locked to the data. Exemplary state transitions are as follows:

| Transition ID | Description | Condition | Action |
|---|---|---|---|
| 13A | VCO is not locked to the reference | $\Delta f_{VR}$ is greater than predetermined threshold ($P_{VR1}$) | VCO frequency tracked against reference clock |
| 13B | CRU 1 achieves VCO to reference clock lock | $\Delta f_{VR}$ is less than predetermined threshold ($P_{VR1}$) | Data qualification begins, VCO frequency remains stable |
| 13C | CRU 1 loses VCO to reference clock lock | $\Delta f_{VR}$ is greater than predetermined threshold ($P_{VR1}$) | VCO frequency tracked against reference clock |
| 13D | CRU 1 maintains VCO to reference clock lock, but data is not valid | $\Delta f_{VR}$ is less than predetermined threshold ($P_{VR1}$) and $\Delta f_{DV}$ is greater than predetermined threshold ($P_{DV1}$) | VCO frequency continues to track reference clock |
| 13E | CRU 1 maintains VCO to reference clock lock, and data is valid | $\Delta f_{VR}$ is less than predetermined threshold ($P_{VR1}$) and $\Delta f_{DV}$ is less than predetermined threshold ($P_{DV1}$) | PD 4 locks VCO frequency and phase to data |
| 13F | Data is invalid | $\Delta f_{DV}$ is greater than predetermined threshold ($P_{DV1}$) or $\Delta f_{VR}$ is greater than predetermined threshold ($P_{VR1}$) | PD 4 locks VCO to reference |
| 13G | Data is valid, VCO phase and frequency locked to data | $\Delta f_{DV}$ is less than predetermined threshold ($P_{DV1}$) | VCO continues to track data frequency and phase |

Unprovisioned Frequency Lock Mode

Figure 14:
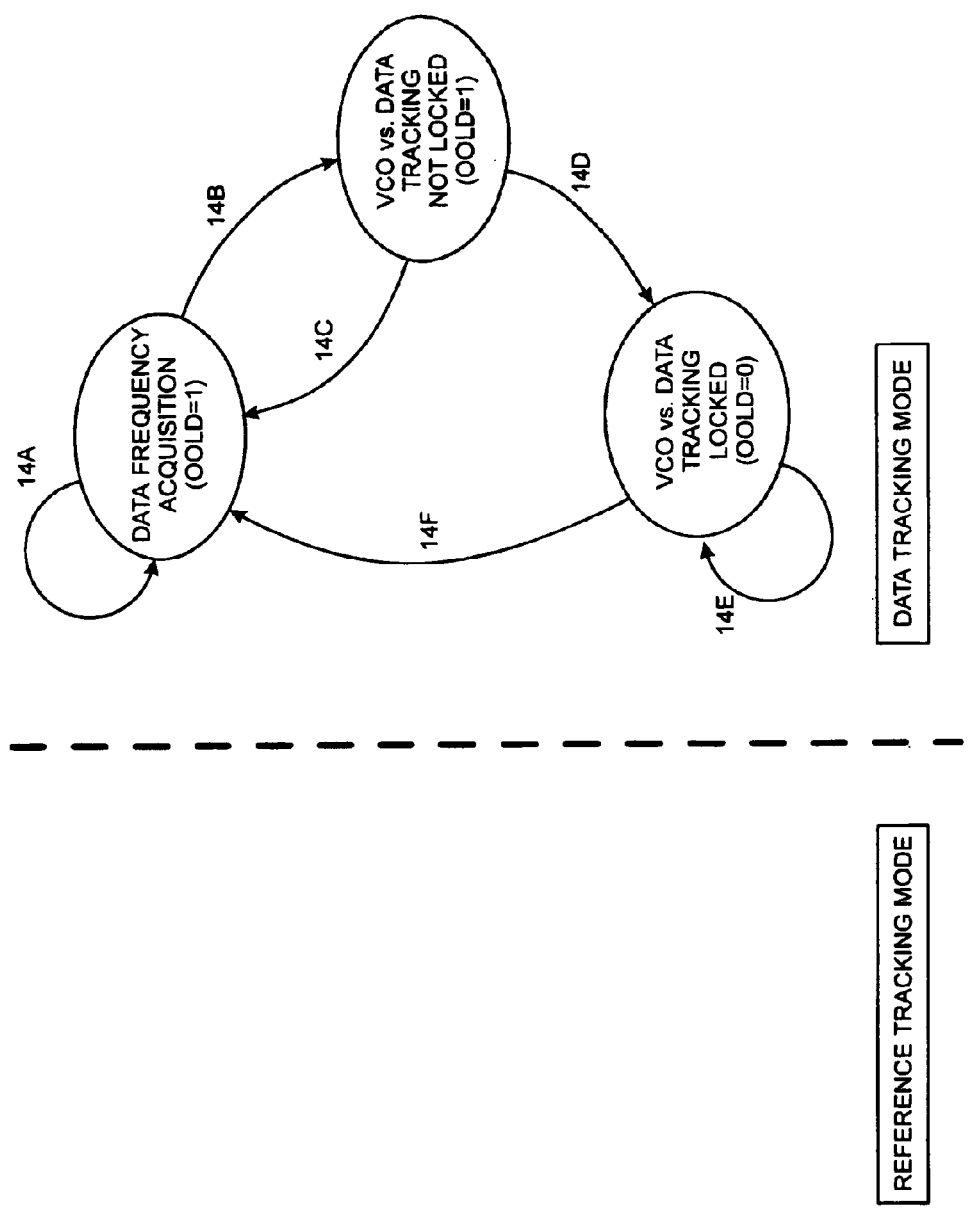
FIG. 14 is a state diagram schematically illustrating an unprovisioned frequency lock without reference mode of operation of the embodiment shown in FIG. 1.

In this application, clock recovery is performed without the aid of a reference clock. Operation begins with data frequency acquisition performed by the DFD 8. When $\Delta f_{DV}$ is within the pull-in range of the PD 4, control of the oscillator 2 is switched to the PD 4 for phase and frequency tracking. Because the data line rate is unprovisioned, there is no indication of whether the incoming data signal is valid, therefore OOLD remains high until $\Delta f_{DV}$ is very close to zero. FIG. 14 illustrates the operation of the unprovisioned frequency lock mode. Exemplary transitions of the state machine are as follows:

| Transition ID | Description | Condition | Action |
|---|---|---|---|
| 14A | VCO is not locked to the data | $\Delta f_{DV}$ is greater than predetermined threshold ($P_{DV1}$) | VCO frequency tracked against data |
| 14B | Data is valid, coarse data frequency acquisition complete | $\Delta f_{DV}$ is less than predetermined threshold ($P_{DV2}$) | DFD 8 maintains VCO control, fine tuning for data frequency begins |
| 14C | CRU 1 loses VCO to data lock | $\Delta f_{DV}$ is greater than predetermined threshold ($P_{DV2}$) | VCO frequency tracked against data |
| 14D | Fine resolution data frequency lock is acquired | $\Delta f_{DV}$ is less than predetermined threshold ($P_{DV3}$) | VCO control is switched to PD 4 for phase lock to the data |
| 14E | VCO frequency and phase locked to data | $\Delta f_{DV}$ is less than predetermined threshold ($P_{DV3}$) | PD 4 retains control of VCO |
| 14F | VCO losses lock with data | $\Delta f_{DV}$ is greater than predetermined threshold ($P_{DV3}$) | VCO control is switched to DFD 8 for frequency acquisition |

Clock Synthesizer Mode

In this application, VCO frequency is locked directly to the reference clock without the requirement for input data signal. FIG. 15 illustrates the state machine required for this mode. A low level asserted for OOLR indicates that VCO is locked to the reference. Exemplary transitions of the state machine are as follows:

| Transition ID | Description | Condition | Action |
|---|---|---|---|
| 15A | VCO is not locked to the reference | $\Delta f_{VR}$ is greater than predetermined threshold ($P_{VR1}$) | VCO frequency tracked against reference clock |
| 15B | CRU 1 achieves VCO to reference clock lock | $\Delta f_{VR}$ is less than predetermined threshold ($P_{VR1}$) | VCO frequency stable |
| 15C | CRU 1 loses VCO to reference clock lock | $\Delta f_{VR}$ is greater than predetermined threshold ($P_{VR1}$) | VCO frequency tracked against reference clock |
| 15D | CRU 1 maintains VCO to reference clock lock | $\Delta f_{VR}$ is less than predetermined threshold ($P_{VR1}$) | VCO frequency stable |

The embodiment(s) of the invention described above is(are) intended to be exemplary only. The scope of the invention is therefore intended to be limited solely by the scope of the appended claims.

We claim:

1. A digital frequency detector for detecting a difference between a frequency of an oscillator output signal and a frequency of a data signal, the digital frequency detector comprising:

a) first digital sample means for sampling the oscillator output signal at a timing of the data signal to generate a first beat signal;

b) second digital sample means for sampling a quadrature clock signal at a timing of the data signal to generate a second beat signal; and c) third digital sample means for sampling the second beat signal at a timing of the first beat signal to generate a frequency error signal.

2. A digital frequency detector as claimed in claim 1, wherein a frequency of the quadrature clock signal is substantially identical to that of the oscillator output signal, and a phase difference between the quadrature clock signal and the oscillator output signal is between about 45° and 135°.

3. A digital frequency detector as claimed in claim 2, wherein a phase difference between the quadrature clock signal and the oscillator output signal is about 90°.

4. A digital frequency detector as claimed in claim 1, wherein the first sample means comprises:

a) a pair of digital latch circuits respectively adapted to sample the oscillator output signal on rising and falling edges of the data signal; and b) a multiplexor adapted to selectively switch between respective outputs of the pair of digital latch circuits on transitions of the data signal.

5. A digital frequency detector as claimed in claim 1, wherein the second sample means comprises:

a) a pair of digital latch circuits respectively adapted to sample the quadrature clock signal on rising and falling edges of the data signal; and b) a multiplexor adapted to selectively switch between respective outputs of the pair of digital latch circuits on transitions of the data signal.

6. A digital frequency detector as claimed in claim 1, wherein the frequency error signal is a differential signal comprising a complementary pair of first and second error signals, a difference between values of the first and second error signals indicating a frequency difference between the recovered clock signal and the data signal.

7. A digital frequency detector as claimed in claim 6, wherein the third sample means comprises:
 a) a first digital flip-flop circuit adapted to sample the second beat signal on rising edges of the first beat signal;
 b) a second digital flip-flop circuit adapted to sample the second beat signal on falling edges of the first beat signal;
 c) a first logic gate adapted to output the first error signal when both the first beat signal and an output of the first digital flip-flop circuit are at a logical high level; and
 d) a second logic gate adapted to output the second error signal when the first beat signal is at a logical low level and an output of the second digital flip-flop circuit is at a logical high level.

8. A digital frequency detector as claimed in claim 7, wherein the third sample means further comprises a digital delay circuit adapted to delay the first beat signal with respect to the second beat signal by a predetermined delay period, whereby a delayed first beat signal is supplied to the first and second digital flip-flop circuits and the first and second logic gates.

9. A digital frequency detector as claimed in claim 8, wherein the predetermined delay period is sufficiently long to permit the second beat signal to settle at respective inputs of the first and second digital flip-flop circuits.

10. A digital frequency detector as claimed in claim 9, wherein the predetermined delay period is less than a period of the oscillator output signal.

11. A digital frequency detector as claimed in claim 1, further comprising data-lock indicator means for generating a lock-indicator signal indicative of a frequency-lock condition between the oscillator output signal and the data signal.

12. A digital frequency detector as claimed in claim 11, wherein the data lock indicator means comprises:
 a) frequency counter means for quantitatively determining a frequency difference between the oscillator output signal and the data signal, and adapted to generate a threshold indicator signal indicative of whether the frequency difference is greater or less than a predetermined threshold; and
 b) a state machine adapted to debounce the threshold indicator signal to generate the lock-indicator signal.

13. A digital frequency detector as claimed in claim 12, wherein the frequency counter means comprises:
 a) a counter for counting, during a predetermined sample period, a number of transitions of either one of the second beat signal and a third beat signal;
 b) comparing means for comparing the counted number of transitions to a predetermined limit value, and for generating the threshold indicator signal indicative of a result of the comparison;
 the predetermined threshold being defined as a function of the predetermined sample period and the predetermined limit value.

14. A digital frequency detector as claimed in claim 13, wherein the third beat signal is generated by a multiplexor adapted to alternately select respective outputs of a pair of digital flip-flop circuits at a timing of transitions of the first beat signal, the pair of digital flip-flop circuits being adapted to sample the second beat signal on respective rising and falling edges of the first beat signal.

15. A digital frequency detector as claimed in claim 13, wherein the comparing means is adapted to generate a value of the threshold-indicator signal indicative of an in-lock condition when the counted number of transitions is less than the predetermined limit value, and is adapted to generate a value of the threshold-indicator signal indicative of an out-of-lock condition when the counted number of transitions is equal to or greater than the predetermined limit value.

16. A digital frequency detector as claimed in claim 15, wherein the sample period is adjustable to control the threshold value.

17. A digital frequency detector as claimed in claim 14, wherein the counter means comprises:
 a) a first digital edge detector circuit responsive to the multiplexor to generate an enable signal at a timing corresponding to transitions of the third beat signal;
 b) a second digital edge detector circuit adapted to generate a reset signal at a timing corresponding to transitions of a sample clock; and
 c) a digital counter circuit adapted to count cycles of the enable signal and to generate a pulse count signal indicative of the number of pulses of the enable signal counted between reception of consecutive pulses of the reset signal.

18. A digital frequency detector as claimed in claim 17, wherein the comparing means comprises a magnitude detector adapted to compare the counted number of pulses to the predetermined limit value, and to generate the threshold-indicator signal indicative of whether the number of pulses counted during the predetermined sample period is greater or less than the predetermined limit value.

19. A digital frequency detector as claimed in claim 18, wherein the comparing means further comprises a latch adapted to sample the comparison signal at a timing of the predetermined sample period to generate the lock-indicator signal.

20. A digital frequency detector a claimed in claim 12, wherein the state machine is adapted to:
 a) sample successive values of the lock-indicator signal; and
  i) transition to a DVIL state when a density of sampled values of the lock-indicator signal indicative of an out-of-lock condition exceeds a predetermined density tolerance; and
  ii) transition to a DVIH state if a predetermined number of consecutive sampled values of the lock-indicator signal are indicative of an in-lock condition.

21. A digital frequency detector as claimed in claim 20, wherein the predetermined density tolerance is 50%.

22. A digital frequency detector as claimed in claim 20, wherein the predetermined number is 1.

23. A digital frequency detector as claimed in claim 11, wherein the data lock indicator means is a fixed window phase lock indicator adapted to generate the lock-indicator signal on a basis of a proportion of time, in relation to the predetermined sample period, for which the second beat signal is t a logical-low level.

24. A digital frequency detector as claimed in claim 23, wherein the fixed window phase lock indicator comprises:
 a) means for generating a reset signal at a timing of the predetermined sample period; and
 b) an N-bit counter adapted to:

i) count bits of the oscillator output signal while the second beat signal is at a logical-low level, and accumulate the count in an N-bit counter;

ii) generate an over-flow signal indicative of an over-flow state of the N-bit counter; and iii) reset a counted number of bits to zero upon receipt of the reset signal.

25. A digital frequency detector as claimed in claim 24, wherein the means for generating a reset signal comprises a $2^M$ frequency divider (where M is a positive integer) adapted to generate the reset signal by frequency-division of the oscillator output signal.

26. A digital frequency detector as claimed in claim 25, wherein values of N and M are selected to provide desired noise-rejection properties of the data lock indicator means.

27. A digital frequency detector as claimed in claim 24, wherein the fixed window phase lock indicator is adapted to assert a value of the lock-indicator signal indicative of an out-of-lock condition when a value of the over-flow signal indicates that the N-bit counter is in an over-flow state, and otherwise assert a value of the lock-indicator signal indicative of an in-lock condition.

28. A digital frequency detector as claimed in claim 27, wherein the fixed window phase lock indicator further comprises:

a) a digital flip-flop circuit adapted to sample the over-flow signal at a timing of the reset signal; and b) a logical-NOR gate adapted to assert a value of the lock-indicator signal corresponding to a value of one of the over-flow signal and an output of the digital flip-flop circuit.

29. A digital frequency detector as claimed in claim 11, wherein the data lock-indicator means is a sliding window phase lock indicator adapted to generate the lock-indicator signal on a basis of a series of N consecutive samples of the second beat signal.

30. A digital frequency detector as claimed in claim 29, wherein the sliding window phase lock indicator is adapted to assert a value of the lock-indicator signal indicative of an out-of-lock condition if at least 2 out of N+1 consecutive samples of the second beat signal are at a logical low value, and assert a value of the lock-indicator signal indicative of an in-lock condition if at least N consecutive samples of the second beat signal are at a logical high value.

31. A digital frequency detector as claimed in claim 29, wherein the sliding window data frequency lock indicator comprises:

a) an input digital flip-flop circuit adapted to sample the second beat signal at a timing of a predetermined sample period;

b) an N-bit shift register connected to the input digital flip-flop circuit and adapted to store N consecutive samples of the second beat signal;

c) a first logic gate adapted to assert a high value of a first gate output signal when at least one of the N bits of the shift register, and an output of the input digital flip-flop circuit are at a low value;

d) a second logic gate adapted to assert a high value of a second gate output signal when all N bits of the shift register are at a high value; and e) an output digital flip-flop circuit adapted to assert a value of the lock-indicator signal based on the first and second gate output signals.

32. A system for recovering a clock signal from a data signal, comprising:

a) an oscillator adapted to generate an oscillator output signal;

b) a digital frequency detector adapted to generate a frequency error signal indicative of a detected frequency difference between the data signal and the oscillator output signal, the digital frequency detector comprising:

i) first digital sample means for sampling the oscillator output signal at a timing of the data signal to generate a first beat signal;

ii) second digital sample means for sampling a quadrature clock signal at a timing of the data signal to generate a second beat signal; and iii) third digital sample means for sampling the second beat signal at a timing of the first beat signal to generate a frequency error signal;

c) a phase detector adapted to generate a phase error signal indicative of a detected phase difference between the data signal and the oscillator output signal;

d) lock-detecting means responsive to the digital frequency detector for detecting an out-of-lock condition between the data signal and the recovered clock signal; and e) control means responsive to the lock-detecting means and adapted to control the oscillator to generate the oscillator output signal on the basis of the digital frequency detector during an out-of-lock condition, and otherwise to generate the oscillator output signal on the basis of the phase detector.

33. A system as claimed in claim 32, wherein the lock-detecting means comprises a frequency lock detector responsive to the digital frequency detector and adapted to generate a lock-indicator signal indicative of a frequency-lock condition between the data signal and the oscillator output signal.

34. A system as claimed in claim 33, wherein the control means comprises:

a) a state machine responsive to the lock-indicator signal and adapted to generate a control signal; and b) selection means responsive to the control signal and adapted to selectively enable control of the oscillator by either the first or second detector means.

35. A system as claimed in claim 32, wherein a frequency of the quadrature clock signal is substantially identical to that of the oscillator output signal, and a phase difference between the quadrature clock signal and the oscillator output signal is between about 45° and 135°.

36. A system as claimed in claim 35, wherein a phase difference between the quadrature clock signal and the oscillator output signal is approximately 90°.

37. A system as claimed in claim 32, wherein the first sample means comprises:

a) a pair of digital latch circuits respectively adapted to ample the oscillator output signal on rising and falling edges of the data signal; and b) a multiplexor adapted to selectively switch between respective outputs of the pair of digital latch circuits on transitions of the data signal.

38. A system as claimed in claim 32, wherein the second sample means comprises:

a) a pair of digital latch circuits respectively adapted to sample the quadrature clock signal on rising and falling edges of the data signal; and b) a multiplexor adapted to selectively switch between respective outputs of the pair of digital latch circuits on transitions of the data signal.

39. A system as claimed in claim 32, wherein the frequency error signal is a differential signal comprising a complementary pair of first and second error signals, a difference between values of the first and second error signals indicating a frequency difference between the recovered clock signal and the data signal.

40. A system as claimed in claim 39, wherein the third digital sample means comprises:
   a) a first digital flip-flop circuit adapted to sample the second beat signal on rising edges of the first beat signal;
   b) a second digital flip-flop circuit adapted to sample the second beat signal on falling edges of the first beat signal;
   c) a first logic gate adapted to output the first error signal when both the first beat signal and an output of the first digital flip-flop circuit are at a logical high level; and
   d) a second logic gate adapted to output the second error signal when the first beat signal is at a logical low level and an output of the second digital flip-flop circuit is at a logical high level.

41. A system as claimed in claim 40, wherein the third digital sample means further comprises a digital delay circuit adapted to delay the first beat signal with respect to the second beat signal by a predetermined delay period, whereby a delayed first beat signal is supplied to the first and second digital flip-flop circuits and the first and second logic gates.

42. A system as claimed in claim 41, wherein the predetermined delay period is sufficiently long to permit the second beat signal to settle at respective inputs of the first and second digital flip-flop circuits.

43. A system as claimed in claim 42, wherein the predetermined delay period is less than a period of the oscillator output signal.

44. A system as claimed in claim 32, wherein the lock-detecting means comprises:
   a) frequency counter means for quantitatively determining a frequency difference between the oscillator output signal and the data signal, and generating a threshold indicator signal indicative of whether the frequency difference is greater or less than a predetermined threshold value; and
   b) a state machine adapted to debounce the threshold indicator signal to generate a lock-indicator signal.

45. A system as claimed in claim 44, wherein the frequency counter means comprises:
   a) a counter for counting, during a predetermined sample period, a number of transitions of either one of the second beat signal and a third beat signal;
   b) comparing means for comparing the counted number of transitions to a predetermined limit value, and for generating the threshold indicator signal indicative of a result of the comparison;
   the predetermined threshold value being defined by a function of the predetermined sample period and the predetermined limit value.

46. A system as claimed in claim 45, wherein the third beat signal is generated by a multiplexor adapted to alternately select respective outputs of each of a first and second digital flip-flop circuit at a timing of transitions of the first beat signal.

47. A system as claimed in claim 45, wherein the comparing means is adapted to generate a value of the threshold-indicator signal indicative of an in-lock condition when the counted number of transitions is less than the predetermined limit value, and is adapted to generate a value of the threshold-indicator signal indicative of an out-of-lock condition when the counted number of transitions is equal to or greater than the predetermined limit value.

48. A system as claimed in claim 47, wherein the sample period can be adjusted.

49. A system as claimed in claim 45, wherein the frequency counter means comprises:
   a) a first digital edge detector circuit responsive to a fourth sample means to generate an enable signal at a timing corresponding to transitions of the third beat signal;
   b) a second digital edge detector circuit adapted to generate a reset signal at a timing corresponding to transitions of a sample clock; and
   c) a digital counter circuit adapted to count pulses of the enable signal and to generate a pulse count signal indicative of the number of pulses counted between reception of consecutive pulses of the reset signal.

50. A system as claimed in claim 49, wherein the comparing means comprises a magnitude detector adapted to compare the counted number of pulses to a predetermined threshold, and to generate the threshold-indicator signal indicative of whether the number of cycles counted during the predetermined sample period is greater, equal to or less than the predetermined limit value.

51. A system as claimed in claim 50, wherein the comparing means further comprises a latch adapted to sample the comparison signal at a timing of the predetermined sample period to generate the lock-indicator signal.

52. A system as claimed in claim 44, wherein the state machine comprises monitor means adapted to sample successive values of the lock-indicator signal, the state machine being adapted to:
   a) transition to a DVIL state when a density of sampled values of the lock-indicator signal indicative of an out-of-lock condition exceeds a predetermined density tolerance; and
   b) transition to a DVIH state if a predetermined number of consecutive sampled values of the lock-indicator signal are indicative of an in-lock condition.

53. A system as claimed in claim 52, wherein the predetermined density tolerance is 50%.

54. A system as claimed in claim 52, wherein the predetermined number is 1.

55. A system as claimed in claim 33, wherein the lock-detecting means is a fixed window phase lock indicator adapted to generate the lock-indicator signal on a basis of a proportion of time, in relation to a predetermined sample period, for which the second beat signal is at a logical-low level.

56. A system as claimed in claim 55, wherein the fixed window phase lock indicator comprises:
   a) means for generating a reset signal at a timing of the predetermined sample period; and
   b) an N-bit counter adapted to:
      i) count bits of the oscillator output signal while the second beat signal is at a logical-low level;
      ii) generate an over-flow signal indicative of an over-flow state of the N-bit counter; and
      iii) reset a counted number of bits to zero upon receipt of the reset signal.

57. A system as claimed in claim 56, wherein the means for generating a reset signal comprises a $2^M$ frequency divider adapted to generate the reset signal by frequency-division of the oscillator output signal.

58. A system as claimed in claim 57, wherein values of N and M are selected to provide desired noise-rejection properties of the data lock indicator means.

59. A system as claimed in claim 56, wherein the fixed window phase lock indicator is adapted to assert a value of the lock-indicator signal indicative of an out-of-lock condition when a value of the over-flow signal indicates that the N-bit counter is in an over-flow state, and otherwise assert a value of the lock-indicator signal indicative of an in-lock condition.

60. A system as claimed in claim 59, wherein the fixed window phase lock indicator further comprises:
 a) a digital flip-flop circuit adapted to sample the over-flow signal at a timing of the reset signal; and
 b) a logical-NOR gate adapted to assert a value of the lock-indicator signal corresponding to a value of one of the over-flow signal and an output of the digital flip-flop circuit.

61. A system as claimed in claim 33, wherein the lock detecting means is a sliding window phase lock indicator adapted to generate the lock-indicator signal on a basis of a series of N consecutive samples of the second beat signal.

62. A system as claimed in claim 61, wherein the sliding window phase lock indicator is adapted to assert a value of the lock-indicator signal indicative of an out-of-lock condition if at least 2 out of N+1 consecutive samples of the second beat signal are at a logical low value, and assert a value of the lock-indicator signal indicative of an in-lock condition if at least N consecutive samples of the second beat signal are at a logical high value.

63. A system as claimed in claim 61, wherein the sliding window phase lock indicator comprises:
 a) an input digital flip-flop circuit adapted to sample the second beat signal at a timing of a predetermined sample period;
 b) an N-bit shift register connected to the input digital flip-flop circuit and adapted to store N consecutive samples of the second beat signal;
 c) a first logic gate adapted to assert a high value of a first gate output signal when at least one of the N bits of the shift register, and an output of the input digital flip-flop circuit are at a low value;
 d) a second logic gate adapted to assert a high value of a second gate output signal when all N bits of the shift register are at a high value; and
 e) an output digital flip-flop circuit adapted to assert a value of the lock-indicator signal based on the first and second gate output signals.

64. A method of recovering a clock signal from a received data signal, comprising the steps of:
 a) sampling the received data signal using a phase detector that generates a phase error signal indicative of a detected phase difference between the data signal and an oscillator output signal, and a digital frequency detector that performs frequency lock on data signal frequencies that fall outside of a pull-in range of the phase detector;
 b) selecting an output of the phase detector when a detected frequency difference is small and otherwise selecting the output of the digital frequency detector to generate the recovered clock signal; and
 c) using the selected one of the outputs of the phase detector and the digital frequency detector to control an oscillator to generate the recovered clock signal wherein the digital frequency detector performs the steps of:
  i) sampling an in-phase clock at a timing of a data signal to produce a first beat signal;
  ii) sampling a quadrature clock signal at a timing of the first beat signal to produce a second beat signal;
  iii) sampling the second beat signal at a timing of the first beat signal to produce two differential outputs.

65. A method as claimed in claim 64 wherein selecting an output of the phase detector and the digital frequency detector is performed by a control unit.

66. A method as claimed in claim 64 wherein the two differential outputs determine whether a frequency of the recovered clock signal must be increased, decreased or remain unchanged to match a data signal frequency of the received signal.

67. A method as claimed in claim 64 wherein the first beat signal and the second beat signal are used by a data qualification circuit to quantitatively determine a frequency difference between the data signal and the recovered clock signal.

68. A method as claimed in claim 67 wherein transitions of a state of the first and second beat signals are monitored to quantitatively determine a frequency difference between the data signal and the recovered clock signal.

69. A method as claimed in claim 64 wherein operations for recovering the clock signal begin in a reference tracking mode in which the phase detector controls an oscillator to lock to a supplied reference clock, and when a frequency difference between the reference clock and the recovered clock signal is less than a predetermined threshold, the frequency of the recovered clock signal relative to data frequency is monitored.

70. A method as claimed in claim 69 wherein if a difference in a frequency match is smaller than a predetermined threshold, a transition is made to a data tracking mode in which the digital frequency detector controls a frequency of the recovered clock signal to reduce the difference in frequency match between a frequency of the recovered clock signal and a frequency of the data signal.

71. A method as claimed in claim 70 wherein after the digital frequency detector has controlled a frequency of the recovered clock signal to an extent that a difference between the frequency of the recovered clock signal and the frequency of the data signal is less than the predetermined threshold, control of the recovered clock signal is returned to the phase detector.

72. A method as claimed in claim 64 wherein the data signal frequency is known and an appropriate reference clock is supplied, the digital frequency detector providing input to a data qualification circuit that outputs a signal indicative of whether the data received is valid data.

73. A method as claimed in claim 64 wherein clock recovery is performed without a reference clock, comprising the steps of:
 a) data frequency acquisition is performed using the digital frequency detector and the frequency of the recovered clock signal is adjusted until the frequency is within a pull-in frequency range of the phase detector; and
 b) control is switched to the phase detector to lock the frequency of the recovered clock signal to the frequency of the data signal.

74. A method as claimed in claim 73 wherein if the lock between the derived clock signal and the data signal is lost, control is again returned to the digital frequency detector to enable the digital frequency detector to re-adjust the frequency of the derived clock signal.

* * * * *

UNITED STATES PATENT AND TRADEMARK OFFICE
CERTIFICATE OF CORRECTION

PATENT NO. : 6,853,696 B1
DATED : February 8, 2005
INVENTOR(S) : James Moser et al.

It is certified that error appears in the above-identified patent and that said Letters Patent is hereby corrected as shown below:

Column 24,
Lines 61-65, claim 74, should read as follows:
74. A method as claimed in claim 73 wherein if the lock between the recovered clock signal and the data signal is lost, control is again returned to the digital frequency detector to enable the digital frequency detector to re-adjust the frequency of the recovered clock signal.

Signed and Sealed this

Twelfth Day of July, 2005

JON W. DUDAS
*Director of the United States Patent and Trademark Office*